US 6,750,451 B2

(12) United States Patent
Koguchi et al.

(10) Patent No.: US 6,750,451 B2
(45) Date of Patent: Jun. 15, 2004

(54) OBSERVATION APPARATUS AND OBSERVATION METHOD USING AN ELECTRON BEAM

(75) Inventors: Masanari Koguchi, Kunitachi (JP); Kuniyasu Nakamura, Musashino (JP); Kaoru Umemura, Musashino (JP); Yoshifumi Taniguchi, Hitachinaka (JP); Mikio Ichihashi, Nagoya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/183,157

(22) Filed: Jun. 28, 2002

(65) Prior Publication Data

US 2003/0006373 A1 Jan. 9, 2003

(30) Foreign Application Priority Data

Jul. 5, 2001 (JP) ........................................ 2001-204311

(51) Int. Cl.[7] .............................................. H01J 37/26
(52) U.S. Cl. ........................ 250/311; 250/306; 250/307
(58) Field of Search ................................ 250/311, 306, 250/307, 442

(56) References Cited

U.S. PATENT DOCUMENTS

| 3,800,081 | A | * | 3/1974 | Van Oostrum | ................ | 348/80 |
| 5,866,905 | A | * | 2/1999 | Kakibayashi et al. | ........ | 250/311 |
| 6,051,834 | A | * | 4/2000 | Kakibayashi et al. | ........ | 250/311 |
| 6,531,697 | B1 | * | 3/2003 | Nakamura et al. | .......... | 250/311 |
| 6,548,811 | B1 | * | 4/2003 | Nakamura et al. | .......... | 250/311 |
| 6,570,156 | B1 | * | 5/2003 | Tsuneta et al. | ............. | 250/311 |

FOREIGN PATENT DOCUMENTS

| JP | 10-162768 | 11/1996 |
| JP | 2000-065762 | 8/1998 |

* cited by examiner

Primary Examiner—John R. Lee
Assistant Examiner—Anthony Quash
(74) Attorney, Agent, or Firm—Reed Smith LLP; Stanley P. Fisher, Esq.; Juan Carlos A. Marquez, Esq.

(57) ABSTRACT

Disclosed is an observation apparatus and method using an electron beam, capable of measuring stress and strain information on a crystal structure in a specimen using electron beam diffraction images. A method according to the invention includes mounting a specimen on a specimen stage; irradiating a predetermined area in the specimen with an electron beam while scanning the electron beam, and acquiring an enlarged image of a specimen internal structure in the predetermined area; irradiating a specific portion included in the predetermined area and acquiring a diffraction image showing the crystal structure in the specimen; extracting information on the crystal structure in the specimen; displaying the information of the crystal structure in the specimen so as to be superimposed on the acquired enlarged image. The observation method according to the invention can obtain information on the crystal structure in a specimen with a high degree of sensitivity and with a high level of resolution.

5 Claims, 21 Drawing Sheets

F I G. 1
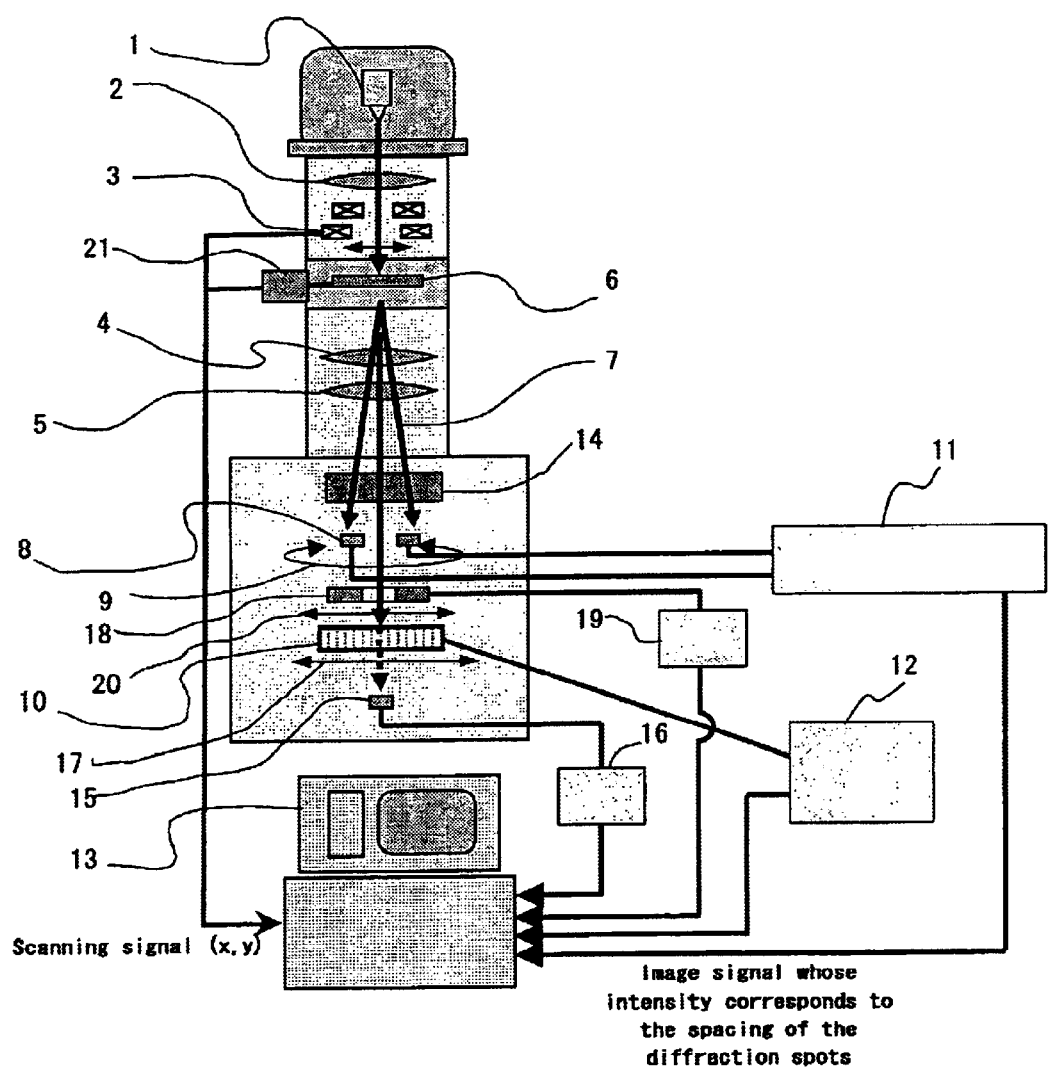
Scanning signal (x,y)
Image signal whose
intensity corresponds to
the spacing of the
diffraction spots Ray trace of magnified image Ray trace of diffraction pattern

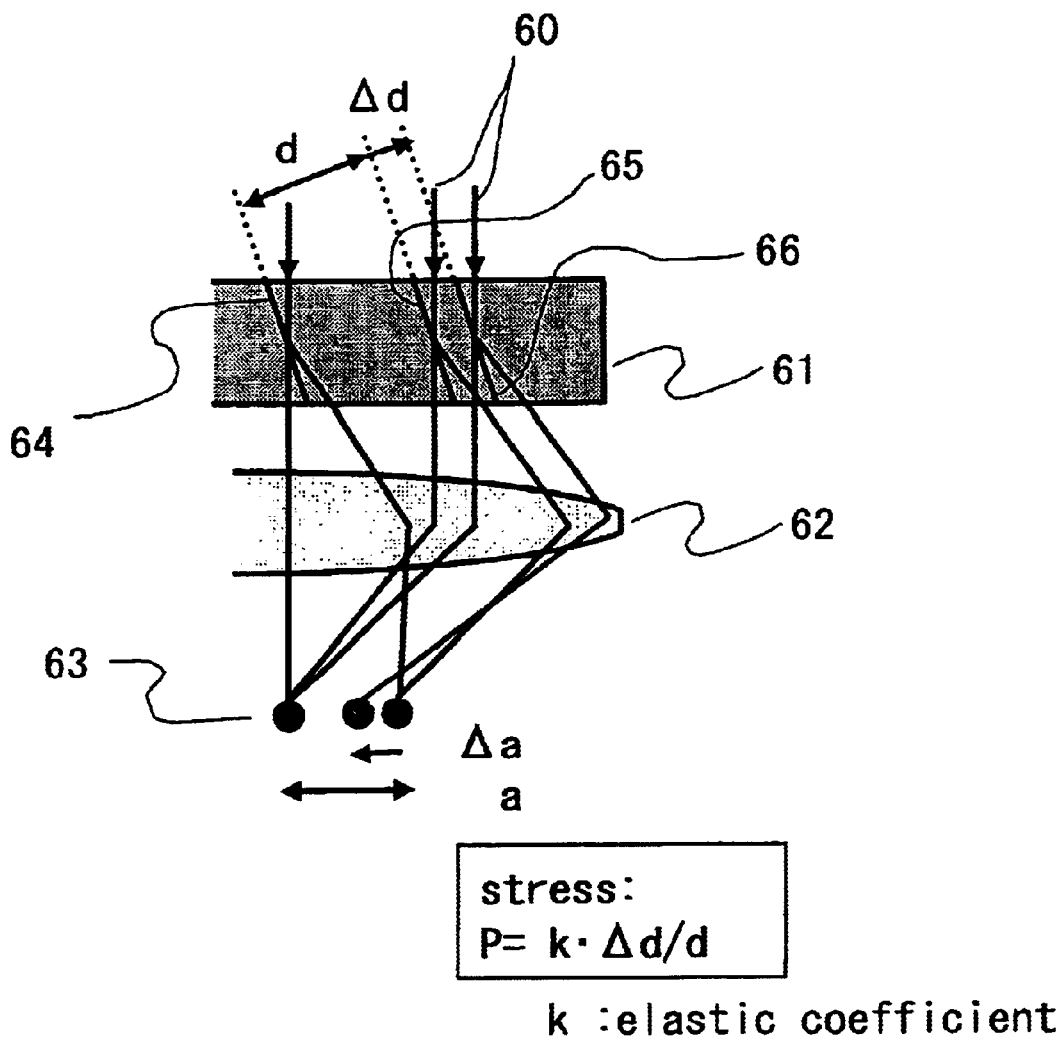
F I G. 3
stress:
$P = k \cdot \Delta d/d$
k : elastic coefficient

F I G. 4
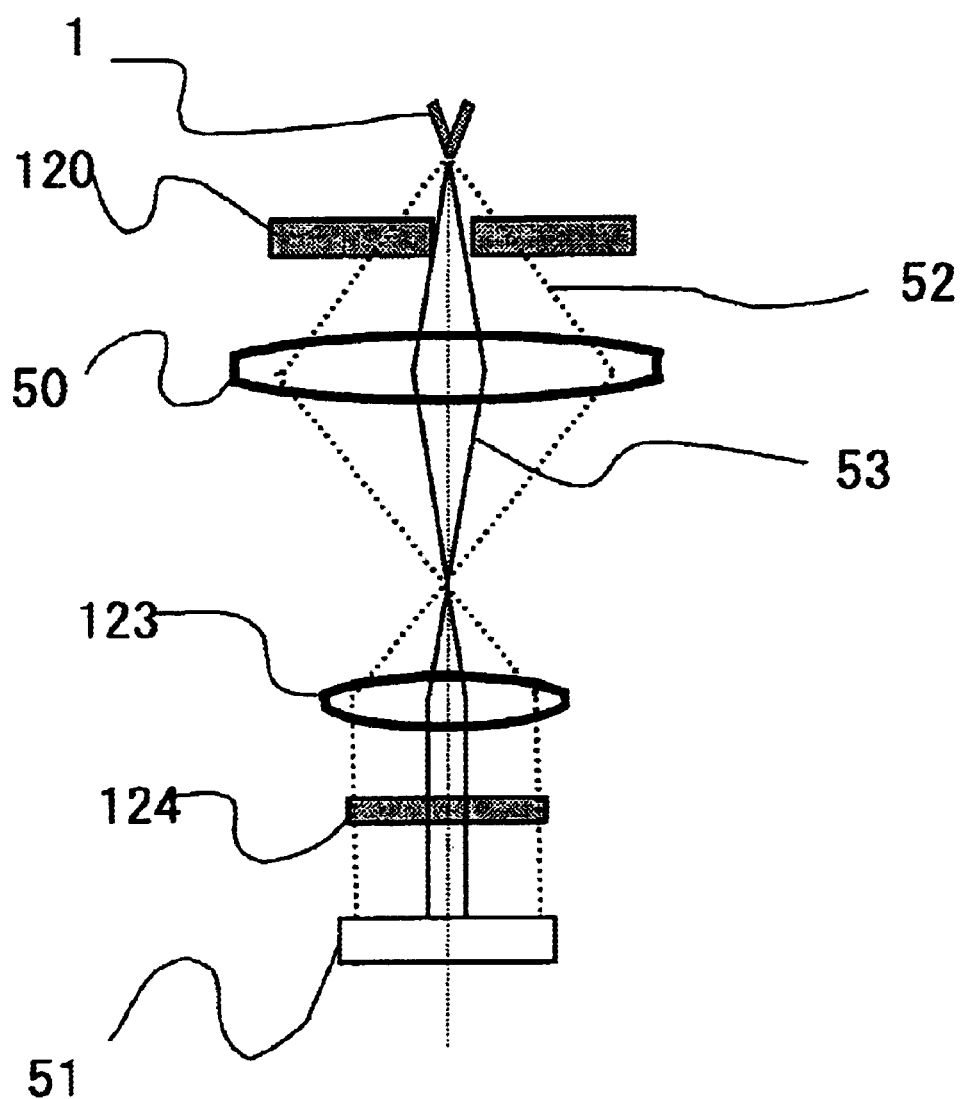

F I G. 1 4
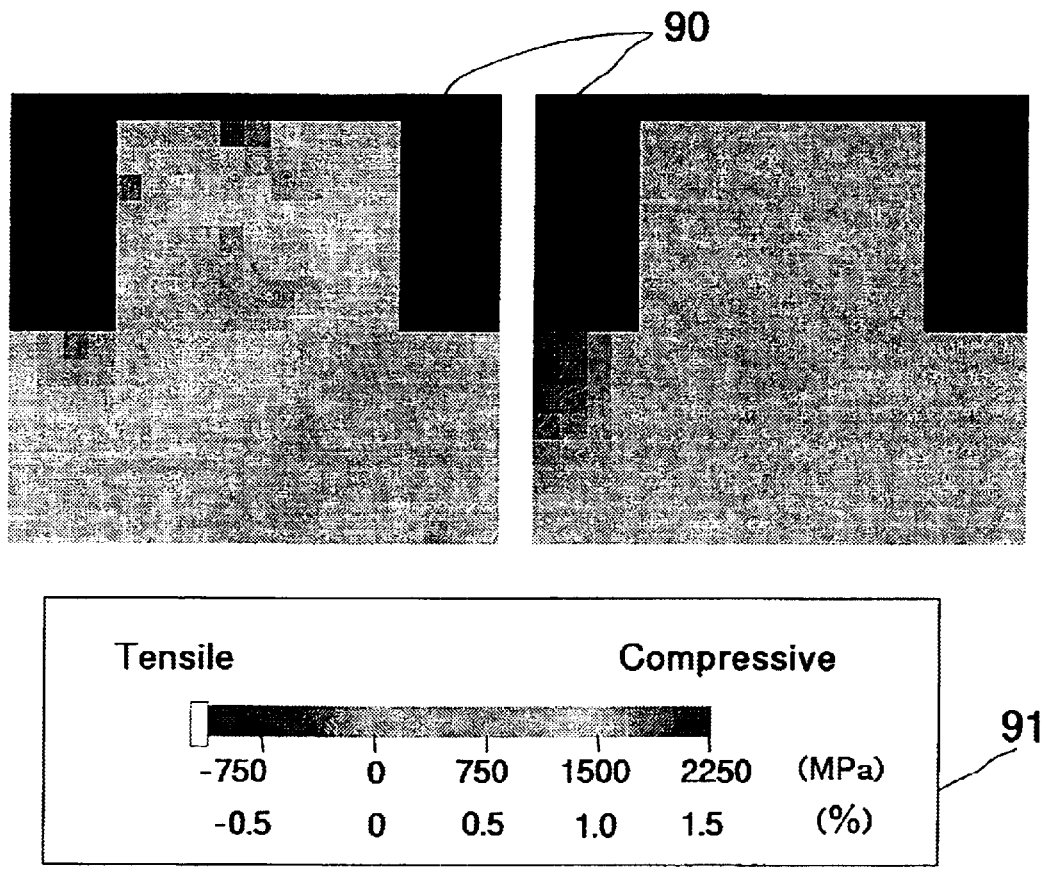

FIG. 20A
FIG. 20B
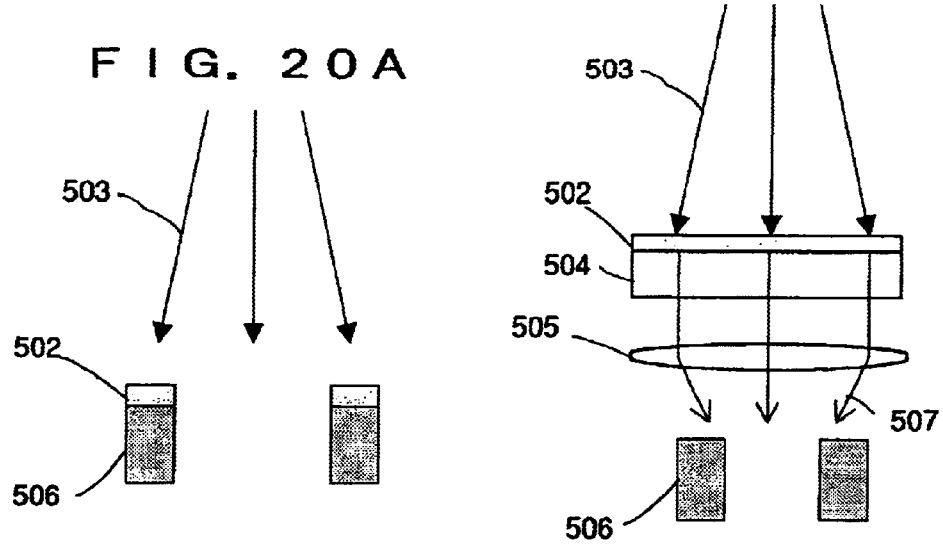
FIG. 20C
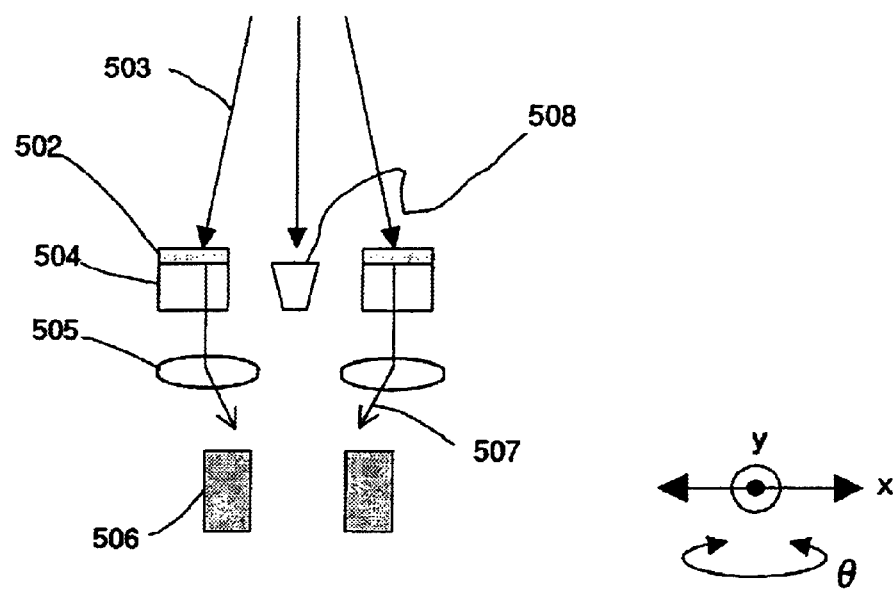

OBSERVATION APPARATUS AND OBSERVATION METHOD USING AN ELECTRON BEAM

BACKGROUND OF THE INVENTION

1. Field of the Invention

The present invention relates to an apparatus and method of observing a crystalline specimen by using a diffraction image observed by an electron microscope.

2. Description of the Related Prior Arts

An example of a conventional technique of measuring a strain from a change amount relative to reference positions of a distance between spot patterns obtained by Fourier transforming an arbitrary micro area in a lattice image observed by enlarging a crystalline specimen by about 200,000 times with a transmission electron microscope, and mapping the strains is disclosed in Japanese Unexamined Patent Application No. 2000-65762 (cited document 1) under the title of "crystal strain measuring method, crystal strain measuring apparatus, and recording medium".

A technique of automatically extracting intersecting positions of HOLZ (High Order Laue Zone) lines appearing in a CBED (Convergent Beam Electron Diffraction) image formed by irradiating a specimen with a condensed electron beam by image processing and displaying the position change amount as a strain amount strength in colors or by using contour lines is disclosed in Japanese Unexamined Patent Application No. 10-162728 (cited document 2) under the title of "Method and apparatus for evaluating lattice strain by using condensed electron beam diffraction figure". An HOLZ line is a kind of a high order diffraction image and, it is conventionally known that its line spacing corresponds to a lattice plane spacing of a crystal in a specimen. That is, a stress and a strain of the crystal in a specimen can be obtained by conversion from a change in the HOLZ line spacing. Since the condensed electron beam emitted to a specimen is usually condensed to a beam diameter of 10 nm$\phi$ or less, the strain and stress can be measured with a resolution of the order of nm.

The measuring method disclosed in Cited Document 1 has a problem such that sensitivity to stress and strain is insufficient. Specifically, lattice widths in a lattice image are larger than a half of lattice spacing, so that if a change in the lattice position is not about 5% or more, a strain amount is not reflected in a Fourier transform image. The strain amount in a silicon semiconductor device is about 3% at the maximum (in many cases 1% or less), which is lower than the detection limit of the measuring method. Consequently, the measuring method has a subject to increase the sensitivity so that a smaller strain or stress amount can be measured.

The measuring method by using a convergent electron beam diffraction disclosed in Cited Document 2 has the following problem. In a high-order diffraction pattern used by the CBED method, a very small lattice strain is reflected in a diffraction pattern very sensitively, so that stress and strain sensitivity is very high. An electron beam for measurement is conversed to 10 nm $\phi$ or less, and spatial resolution is very high. However, since a high-order diffraction pattern of a low intensity appearing in diffraction spots of a transmitted low-order diffraction pattern has to be observed, it is necessary to make a specimen very thin and reduce an inelastic scattering background by using an energy filter. In such a manner, the sample thickness is suppressed to about 100 nm or less. Since the sample is processed to be very thin, the stress and strain are largely relaxed in the film thinning process, and it caused a problem such that it is very difficult to obtain information of the stress and strain originally held in the specimen. When the energy filter is necessary, a problem of higher cost occurs. Further, since high-order diffraction information is used, there is another problem such that the method is highly susceptible to an influence of damage caused by irradiation of an electron beam. Therefore, the measuring method is requested to be developed to a measuring method of observing a low-order diffraction image in a thicker sample.

In short, conditions required to evaluate a stress and a strain in a semiconductor device are realization of the method of observing a low-order diffraction image of a thicker specimen with high spatial resolution and high sensitivity to stress and strain. If even one of the conditions is not satisfied, the technique cannot be practical.

SUMMARY OF THE INVENTION

An object of the invention is therefore to solve the problems of the conventional techniques and to embody a practical stress and strain measuring technique to which a method of observing a low-order diffraction image of a thicker observation specimen with high spatial resolution and high sensitivity to stress and strain can be applied.

More specifically, an object of the invention is to provide a sample observation method using an electron beam, capable of embodying the practical stress and strain measuring technique, and a sample observation apparatus suitable for carrying out the method.

Another object of the invention is to provide a technique capable of visually two-dimensionally displaying a stress/strain distribution in a specimen at high resolution on the basis of a measurement result obtained by using the specimen observation method and apparatus.

Further another object of the invention is to establish peripheral techniques such as an inspection algorithm for a sampling inspection in a manufacturing line of a semiconductor device suitable for use in development of a stress reducing process for manufacturing the semiconductor device on the basis of a measurement result obtained by using the sample observation method and apparatus, the configuration of an inspection system capable of establishing the inspection algorithm, and sampling of an inspection sample.

To achieve the objects of the invention, the invention provides an observation method and apparatus using an electron beam, which has characteristic configuration as described below.

First, to realize observation of a fine crystal structure in a specimen at high resolution, according to the invention, a specimen is irradiated with an electron beam and a diffraction image is obtained from the electron beam diffracted in the specimen. Particularly, to irradiate a specimen with a convergent electron beam having a diameter of 10 nm $\phi$ or less, an electron beam optical path according to a so-called nano-diffraction method for converging an electron beam to a very small beam diameter by a condenser aperture of an electron microscope is employed. In the case of employing the nano-diffraction optical path, a sample can be irradiated with a narrow parallel electron beam. The parallelism of the irradiation electron beam at this time is set to 0.5 mrad or less. This is largely different from the CBED method which emits a not-parallel electron beam at a large irradiation angle of 10 mrad or larger. By irradiating a specimen with a parallel electron beam as described above, the spot diameter of an obtained diffraction image becomes sufficiently small. The lattice plane spacing of a crystal in a specimen can be measured from a spot spacing with high precision, and measurement sensitivity to stress and strain in the sample crystal can be improved. To observe a thick specimen, a diffraction spot (low-order diffraction spot) formed by an electron beam diffracted at the 222 orientation or lower, at which an electron beam absorption is little and a diffraction electron intensity is strong in a specimen is observed. It enables a thicker specimen to be observed, and relaxation of a stress and a strain in a sample which occurs at the time of thinning a specimen can be largely suppressed. By forming a low-order diffraction image by using a nano-diffraction optical path, a stress and a strain in a specimen can be measured at high resolution of 10 nm or less and with high sensitivity of 0.5% or less. Moreover, a sample which is ten times or more as thick as that can be observed by a conventional observation method can be measured. Realization of measurement of a thicker specimen at high resolution and high sensitivity is a very big advantage of the invention.

In the invention, to visually display the stress and strain distributions in a semiconductor device sample obtained by the high-resolution high-sensitivity measuring method, the following technical means is taken. The above-described diffraction image measurement is executed, for example, with respect to tens of spots in a 1-bit transistor device. A similar diffraction image measurement is executed also on a substrate portion of the same bit. A lattice plane spacing as a reference is measured in the substrate portion, and the difference between the reference lattice plane spacing and a lattice plane spacing measured at each measurement spot is obtained and used as a strain amount at the measurement spot. A stress in a specimen is in a proportional relationship with the strain amount of the lattice plane spacing, and its proportionality constant is a value peculiar to the elements in the specimen and a direction of crystal plane and can be preliminarily calculated. Therefore, by two-dimensionally superimposing a change between the diffraction spot in the direction perpendicular to the substrate and the diffraction spot in the direction horizontal to the substrate onto an electron microscope photograph, a two-dimensional distribution of stress and strain can be visually displayed in correspondence with an image of the structure in the device.

To establish a stress reducing process, a transistor device of a bit to be observed is extracted from a wafer on a semiconductor fabrication line and measurement similar to the above is performed. By extracting a specimen before and after a process to which attention is paid, a state of accumulation of a stress and a strain in the portion can be grasped. After performing a process A, a process B is executed on a wafer, and a process C is executed on another wafer, thereby fabricating devices. A device as a specimen is extracted from the wafer subjected to the process B, and a device as a specimen is extracted from the wafer subjected to the process C. The stress and strain amounts of each of the samples (devices) are measured, thereby enabling advantages and disadvantages from the viewpoint of stress and strain of the processes B and C to be grasped. By repeating it, a preferable stress reducing process can be found out.

Other objects, configurations, and action and effects produced by the configurations will become apparent from the following detailed description of embodiments.

BRIEF DESCRIPTION OF THE DRAWINGS

FIG. 1 is a schematic cross section showing an example of the basic configuration of an electron microscope system which can be used to carry out an observation method according to the invention.

FIG. 3 is a schematic view for explaining a state of an electron beam diffraction which occurs when an electron beam passes through a specimen in the observation apparatus according to the invention.

FIG. 4 is a schematic view for explaining an example of an electron beam optical path in a specimen observation method using a nano-diffraction method according to the invention.

FIG. 14 is a schematic view for explaining further another example of the observation result displaying method in the observation method of the invention.

FIGS. 20A, 20B, and 20C are schematic perspective views each showing an example of the configuration of a position detector for use in the observation apparatus according to the invention.

DESCRIPTION OF THE PREFERRED EMBODIMENTS

Embodiments of the invention will be described hereinbelow more concretely with reference to the drawings.

First Embodiment

A first embodiment of the invention will be described in comparison with the prior arts.

In the case of observing a crystalline specimen by a transmission electron microscope (hereinbelow, TEM), due to diffraction and interference phenomena of an electron beam and a specimen, an enlarged image according to a crystal structure, composition, or the like and a diffraction image of a shape corresponding to the crystal structure can be obtained.

Figure 2A:
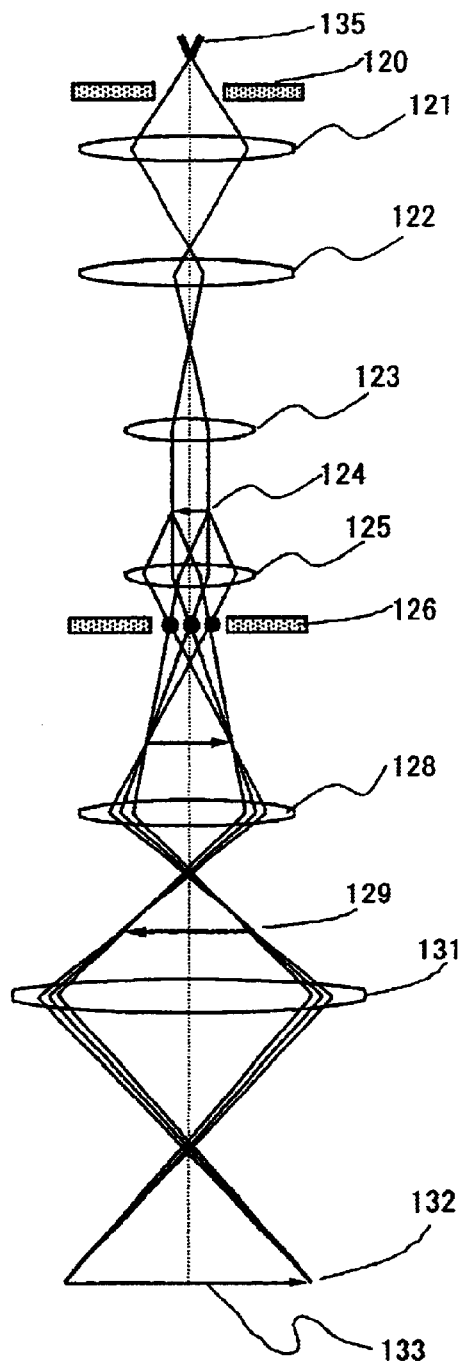
FIGS. 2A and 2B are electron beam optical path diagrams at the time of observing an enlarged image and a diffraction image, respectively, of a specimen in an electron optical system of an electron microscope system which can be used to execute an observation method according to the invention.
Figure 2B:
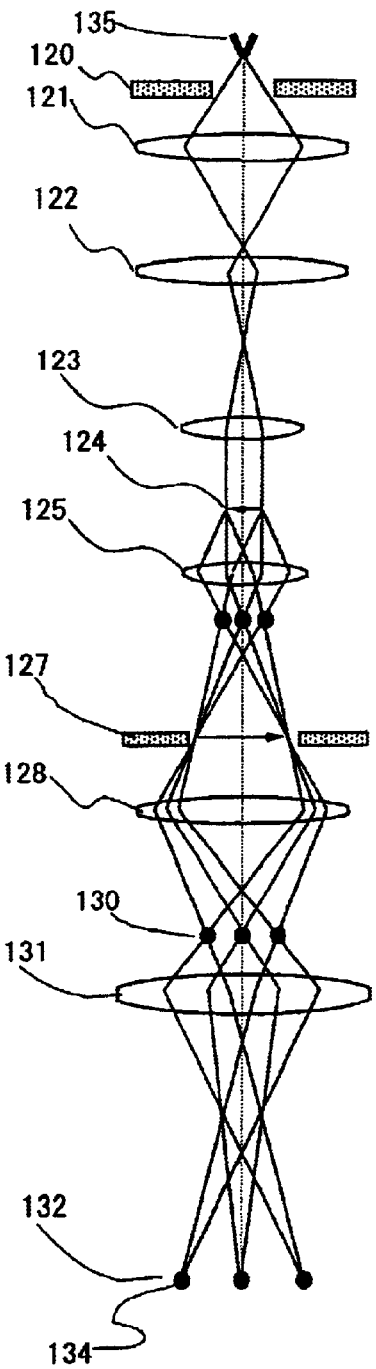

An image forming mechanism in a conventional TEM will be described by referring to FIGS. 2A and 2B. The irradiation angle of an electron beam emitted from an electron source 135 is regulated by a condenser aperture 120. After that, the electron beam is condensed by a first condenser lens 121 and a second condenser lens 122 and is changed to a parallel beam by an objective lens front magnetic field 123. The parallel beam is emitted onto a specimen 124. A part of the electron beam emitted onto the specimen 124 passes through the specimen 124 without interaction with the crystal in the specimen. A part of the remaining electron beam is diffracted by a crystal plane of a crystal in the specimen. A phenomenon which occurs at this time is conventionally known such that, when a crystal plane spacing is "d", a diffraction angle is θ, and an irradiation electron beam wavelength is λ, the intensity of the electron beam diffracted at the diffraction angle θ satisfying an equation of $2d \sin \theta = n\lambda (n=1, 2, 3, \ldots)$ called a Bragg diffraction condition equation increases by an interference effect, but the intensity of the electron beam diffracted at an angle which does not satisfy the condition equation becomes extremely weak.

Usually, the electron beams satisfying the conditional equation at the infinite-point position from the specimen 124 interfere with each other, thereby forming a diffraction image. In a TEM, a diffraction image is formed in a rearward focal plane 126 by an objective lens rear magnetic field 125 directly below the specimen. The diffraction image is two-dimensionally distributed in a plane perpendicular to the axis of the electron beam. Since the diffraction image is a pattern of a shape satisfying the Bragg diffraction condition equation, by analyzing the diffraction image, the crystal structure and the crystal plane spacing can be evaluated. In the TEM, an objective aperture is disposed in the position of the rear focal plane 126 of the objective lens. By the objective lens rear magnetic field 125, an enlarged image of the specimen is formed in a position further rearward (downward) of the rear focal plane 126. The specimen enlarged image is called a first intermediate image 127. In the TEM, a regulated field aperture is disposed in the image formation position of the first intermediate image 127. As described above, two kinds of images of the diffraction image and the specimen enlarged image (first intermediate image 127) are formed in the position rearward (downward) of the objective lens constructed by the front and rear magnetic fields 123 and 125. According to the current condition of the following intermediate lens 128 and a projection lens 131, which image to be formed, magnification of the image, and the like can be selected and determined. In FIG. 2A, the first intermediate image 127 is enlarged to a second intermediate image 129 by the intermediate lens 128, and the second intermediate image 129 is further enlarged to a final enlarged image 133 on an observation plane 132 by the projection lens 131. In FIG. 2B, the diffraction image on the rear focal plane 126 is enlarged to an intermediate diffraction image 130 by the intermediate lens 128 which is set in an exciting current condition different from that in the case of FIG. 2A. The intermediate diffraction image 130 is further enlarged to a final electron diffraction image 134 by the projection lens 131 onto the objection plane 132.

As described above, information regarding the crystal structure can be obtained from the diffraction image. Referring now to FIG. 3, a method of measuring a strain and a stress in the crystal from the diffraction image will be described. When an electron beam 60 enters a specimen 61, the electron beam is diffracted by a crystal plane in the specimen. It is assumed that crystal planes in the case where there is no strain in the specimen crystal are a crystal plane (a) 64 and a crystal plane (b) 65 and, when a strain occurs in the specimen crystal by application of a stress, the crystal plane (b) 65 is shifted to a strained crystal plane 66. Electron beams diffracted by crystal planes are refracted in an electron lens 62 and, as a result, a diffraction image 63 is formed. A distance between diffraction spots in a diffraction image formed in the case where there is no strain is set as "a". A crystal plane spacing "d" and the distance "a" between diffraction spots are in inverse proportion. Therefore, when a change amount of the distance "a" between diffraction spots is set as Δa and a change amount of the spacing "d" between crystal planes is set as Δd, a lattice strain amount Δd/d is obtained from Δa/a. A stress amount P is obtained by multiplying the lattice strain amount Δd/d with an elastic coefficient k as a peculiar proportional coefficient in accordance with the material and the type of the crystal plane, so that P=k·Δd/d is derived. It is therefore understood that a strain amount and a stress amount can be measured from the diffraction image.

The crystal plane spacing (lattice plane spacing) "d" can be conventionally measured from a diffraction image formed by electron beams emitted to a relatively large area of about a few microns. The present invention provides a novel method of measuring a low-order diffraction spot spacing from a diffraction image obtained by using an electron beam irradiating method called a nano-diffraction method which will be described by referring to FIG. 4 and calculating a strain amount and a stress amount from the low-order diffraction spot spacing, and a novel method of automatically analyzing and displaying the obtained strain and stress amounts.

In evaluation of a stress by a semiconductor device or the like in recent years, a high resolving power of about 10 nm or less is important. According to the nano-diffraction method, an excellent diffraction image can be obtained also with respect to a very small part of about 10 nm. By precisely measuring the diffraction spot spacing "a" appearing in the diffraction image 63 shown in FIG. 3, a change amount Δd of the lattice plane spacing "d" is precisely measured. On the other hand, the diameter of the diffraction spot is inversely proportional to the irradiation angle of the electron beam to the specimen. It is therefore important to irradiate the specimen with the electron beam which is made parallel as much as possible.

In FIG. 4, an electron beam is emitted from an electron gun 1. As the electron source 1, it is desirable to use an FE (Field Emission) type electron gun of a type of emitting an electron beam by applying a high voltage to the tip of a thin needle-shaped cathode for the following reason. Since the FE type electron gun has a narrow electron irradiation area and a narrow energy width of an irradiation electron beam, an electron beam can be converged to a very small beam diameter by an electron lens. In this case, the FE electron gun includes both a cold cathode type and a Schottky emission type.

The irradiation angle of an electron beam emitted from the FE electron gun 1 is regulated by the condenser aperture 120. The electron beam is shaped by a condenser lens 50 and the objective lens front magnetic field 123 and is incident on the specimen 124. An enlarged image and a diffraction image of the specimen formed by the electron beams passed through the specimen 124 are detected by a detector 51. In the invention, as shown in FIG. 4, a convergent point is once achieved by the condenser lens 50 before the objective lens front magnetic field 123. Subsequently, the electron beam is expanded to become a parallel beam by the objective lens front magnetic field 123. The specimen 124 is irradiated with the parallel beam. According to the conventional method, the condenser aperture 120 having a beam passage opening (hole) whose diameter is about 300 μmφ is used for the reason that, by using a large opening diameter, a sufficient amount of the electronic beam is emitted to the specimen to thereby obtain a transmission image with sufficient brightness. However, when the diameter of the opening in the condenser aperture stop 120 is large, the electron beam passes a conventional optical path 52 shown in FIG. 4. Consequently, the specimen can be irradiated with a parallel electron beam but the irradiated area becomes large as 100 nm or larger.

In the invention, therefore, by using the condenser aperture having a sufficiently small opening diameter of about 30 μmφ, the diameter of the electron beam is narrowed as shown by a nano-diffraction optical path 53, and the specimen is irradiated with the resultant electron beam. With the configuration, an irradiation area having a diameter of about 10 nm which is a target can be irradiated with the parallel electron beam. The irradiation angle of the electron beam can be set to be as small as 0.4 mrad or less including an influence of an aberration of a lens diameter and the like.

Figure 5:
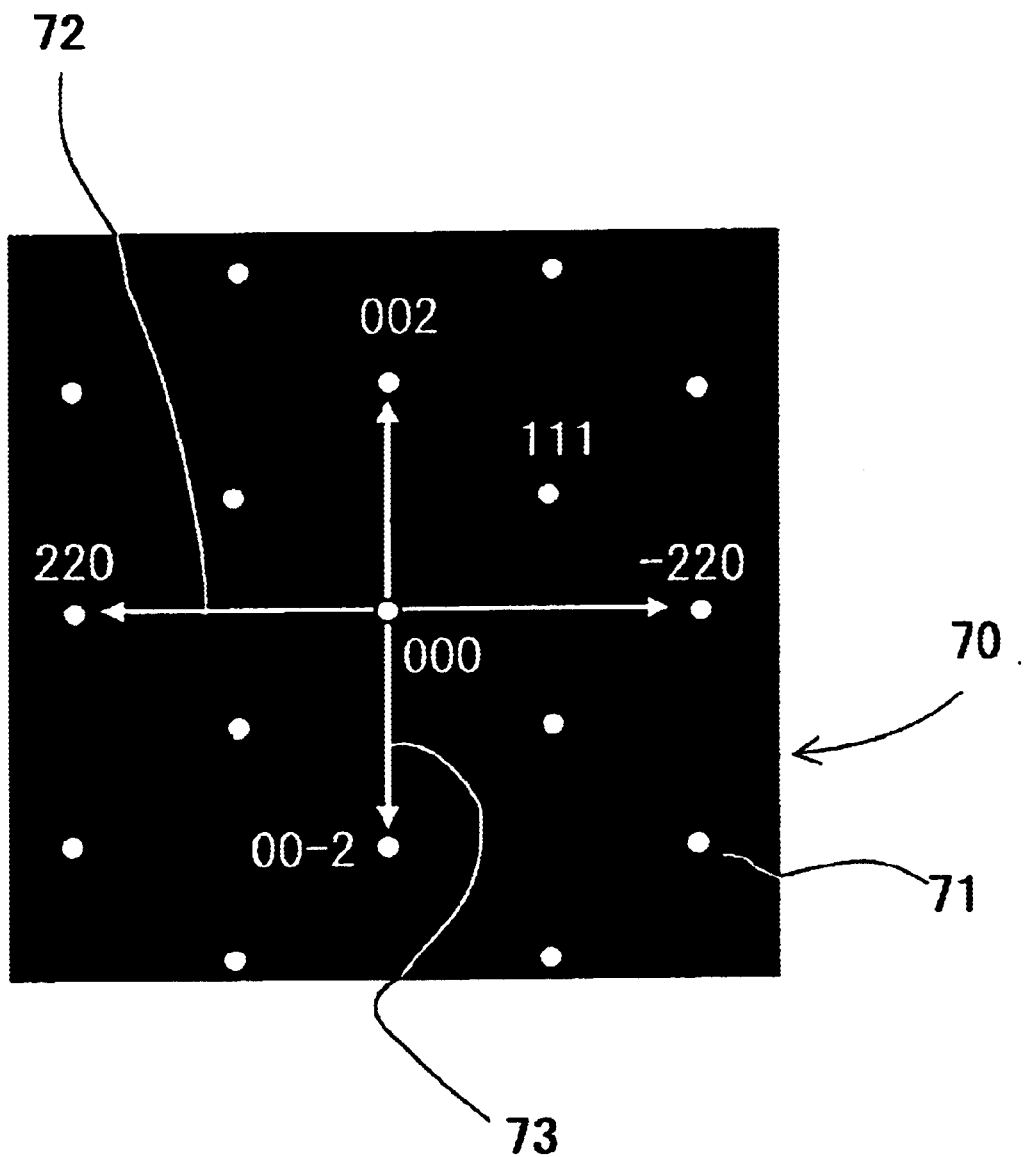
FIG. 5 is a schematic view for explaining an example of a diffraction image pattern (nano-diffraction pattern) acquired by a specimen observation method using the nano-diffraction method according to the invention.

A diffraction image obtained by applying the nano-diffraction method and a method of analyzing the diffraction image will now be described. In the case of observing a sectional image of a silicon semiconductor device, usually, an electron beam enters from the direction of <110> direction, so that a diffraction image 70 is observed typically as shown in FIG. 5. Many diffraction spots 71 appear around the point 000 to which the electron beams passed through the specimen without diffraction are converged. Among them, diffraction spots important for analysis are a point 220 in the direction parallel to the substrate and a point 002 in the vertical direction of the substrate. Specifically, by using the point 000 as a center of symmetry, a distance between equivalent two (220) spots indicates a (220) plane distance, that is, a lattice spacing 72 in the lateral direction of the device. The distance between equivalent two 002 points indicates a (002) plane distance, that is, a lattice spacing 73 in the vertical direction of the device. Therefore, by following a change in the lattice spacings, the strain amount of the crystal plane can be measured.

Figure 6:
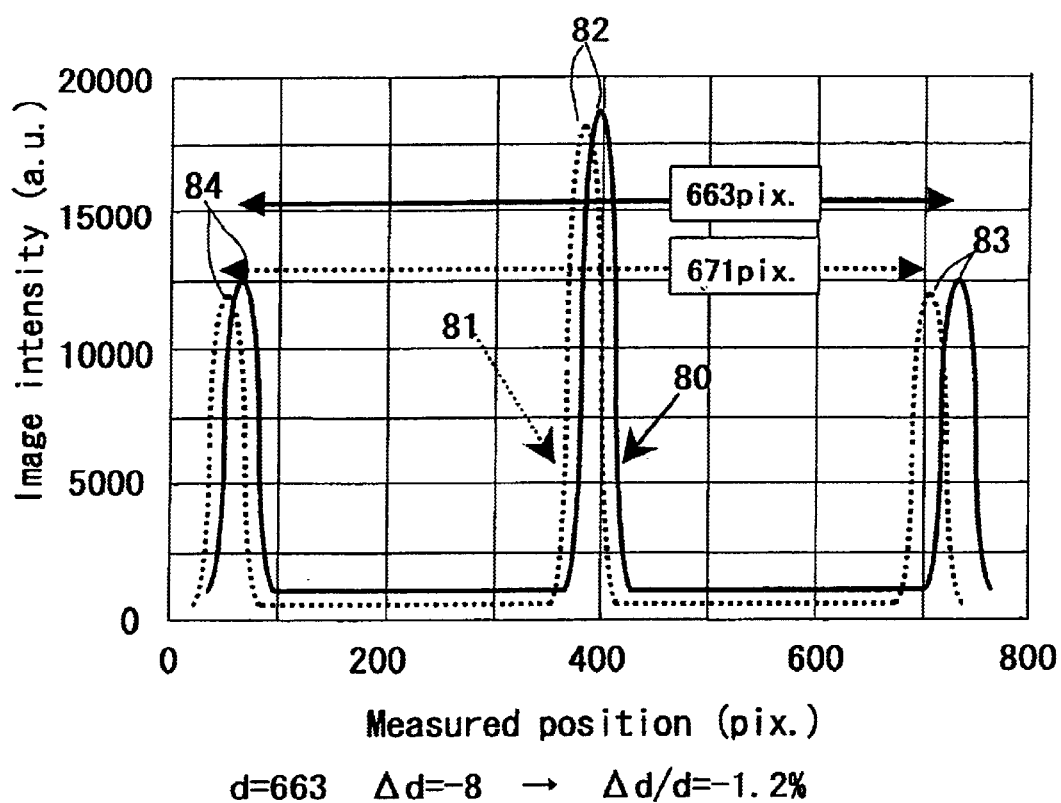
FIG. 6 is a chart showing an example of a diffraction intensity profile in a diffraction image pattern (nano-diffraction pattern) obtained by a specimen observation method using the nano-diffraction method according to the invention.

For example, in the case of obtaining the diffraction image 70 shown in FIG. 5 by a CCD camera for an electron microscope of about 1000×1000 pixels, the lattice spacing can be precisely measured by a method shown in FIG. 6. FIG. 6 shows an intensity profile of the lattice spacing 73 in the vertical direction. A substrate portion profile 80 is a profile obtained from a diffraction image acquired by irradiating a substrate portion in which no device is formed with an electron beam. Similarly, the profile of a diffraction image obtained by irradiating a silicon crystal near a device structure portion which seems to be under stress, with an electron beam is a stressed portion profile 81. As shown in FIG. 6, a profile having maximum values at a 002 point peak 83 and a 00-2 point peak 84 around a 000 point peak 82 as a center appears. By fitting the peak portions of the profile by a Gaussian distribution, Poisson distribution, or the like, peak positions can be accurately obtained. When it is assumed that the distance between the 002 points of the substrate portion profile 800 corresponds to 663 pixels and the distance between the 002 points of the stressed profile 811 corresponds to 671 pixels, the difference between them is −8 pixels. Therefore, the strain amount is a value calculated by dividing the change amount (−8 pixels) of the lattice spacing by the distance between the 002 points of the substrate portion (663 pixels). It is understood that the strain amount is −1.2%. Negative sign of the strain amount denotes increase in the lattice spacing, that is, a strain due to tensile stress. Similarly, positive sign of the strain amount indicates a strain caused by compressive stress.

For actual measurement, four concrete methods by the enlarged image forming method and the electron beam detection method are considered. The four methods will be specifically described hereinbelow by referring to FIGS. 7 to 10.

Figure 7:
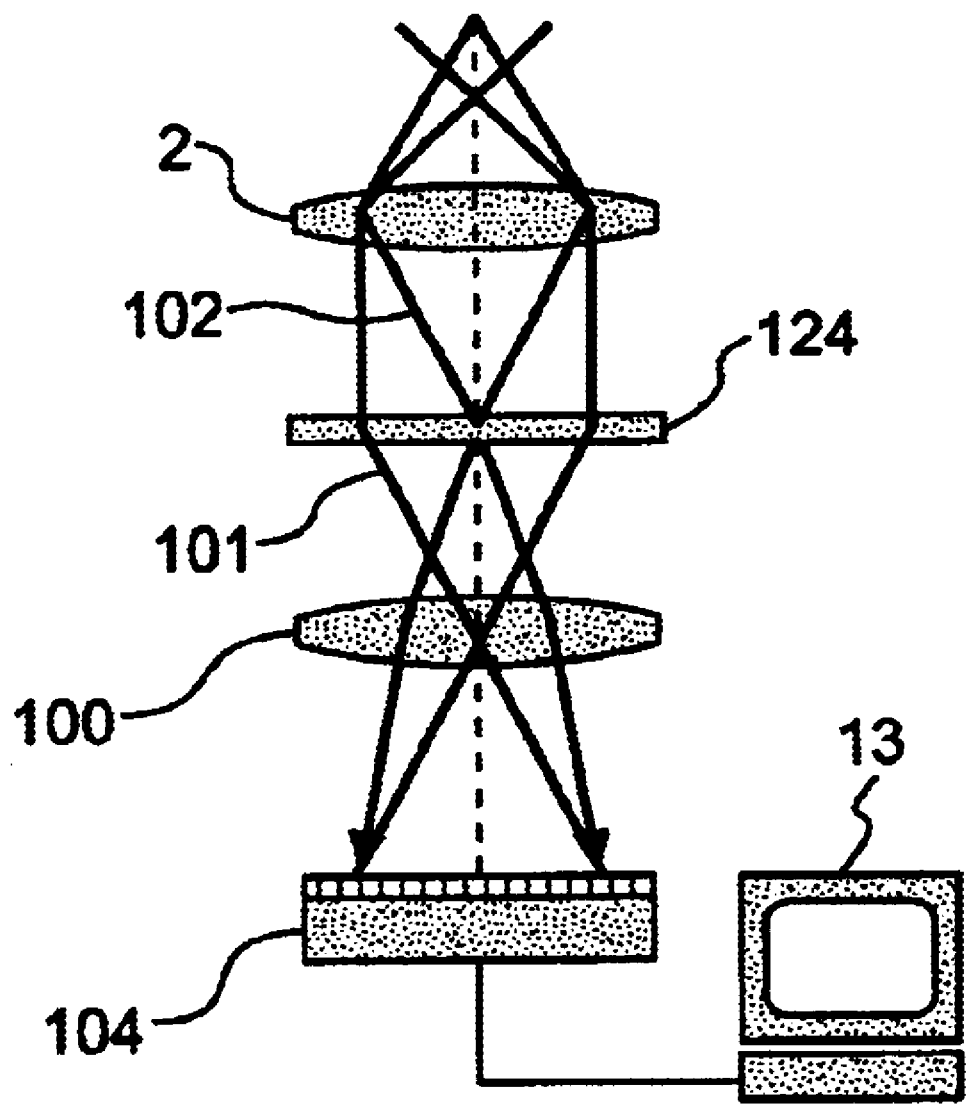
FIG. 7 is a schematic diagram for explaining an example of the configuration of an observation apparatus obtained by assembling a pixel detector in a transmission electron microscope (TEM) system according to the invention.

FIG. 7 is a diagram showing a method of forming an enlarged image and a diffraction image of a specimen by a TEM and detecting both of the images by a pixel detector. In the method, at the time of obtaining an enlarged image for locating an observation spot in a specimen or observing a crystal structure, an irradiation lens 2 is adjusted so that the specimen 124 is irradiated with an irradiation electron beam via a TEM optical path 101. In the case of obtaining a diffraction image by the nano-diffraction method, an exciting current of the irradiation lens 2 is increased to irradiate the specimen 124 with an electron beam via a nano-diffraction optical path 102. Together with the enlarged image and the diffraction image acquired via an image forming lens 100, the incident position and incident intensity of the electron beam are obtained by a pixel detector 104 capable of obtaining the information like an image pickup tube, CCD (Charge-Coupled Devices), and line sensor, and are displayed on a display device 13. The method has an advantage that the result of image capture can be easily displayed on a TV monitor or a personal computer and analyzed, but also has a disadvantage that it is complicated to frequently switch two kinds of electron beam optical paths.

Figure 8:
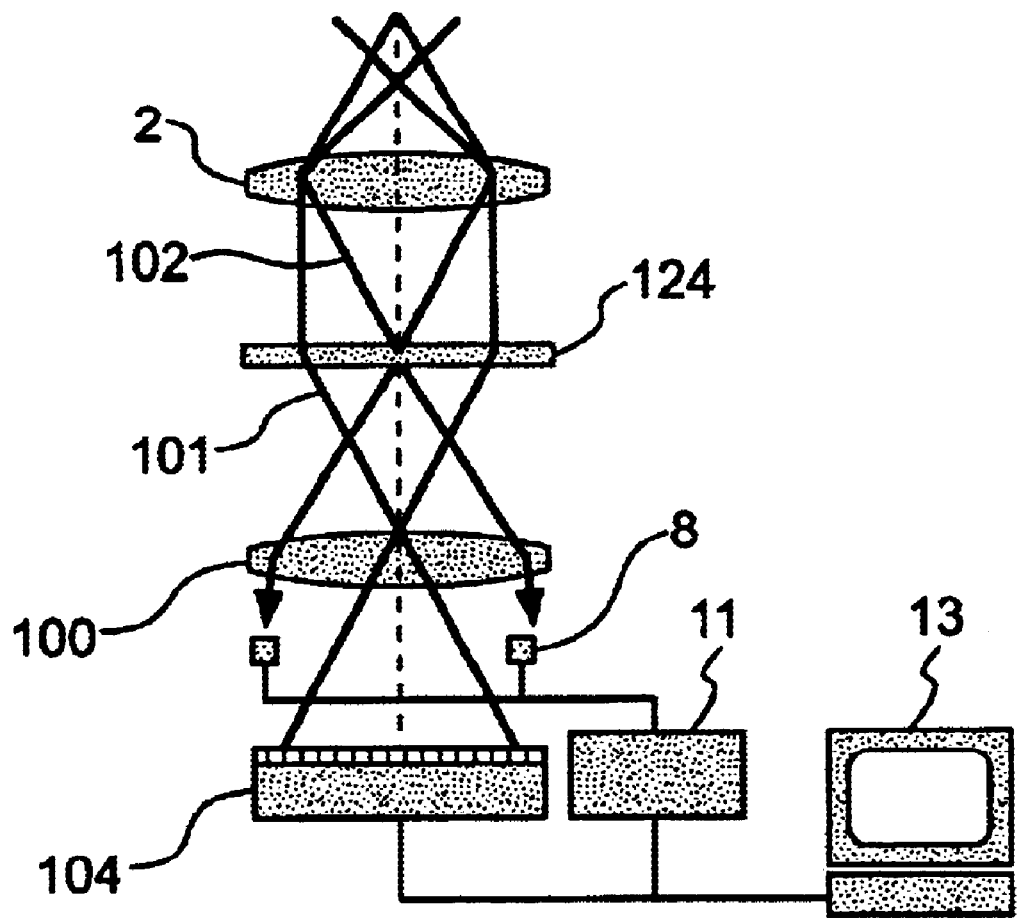
FIG. 8 is a schematic diagram for explaining an example of the configuration of an observation apparatus obtained by assembling both a pixel detector and a position detector in a transmission electron microscope (TEM) system according to the invention.

FIG. 8 is a diagram showing a method of forming an enlarged image and a diffraction image of a specimen by a TEM, detecting the enlarged image by the pixel detector 104, and detecting the diffraction image by a position detector 103. It has been described above by referring to FIG. 6 that the lattice plane spacing is measured by measuring a distance between two diffraction spots. For this purpose, the position detector 103 dedicated to each diffraction spot is disposed. The position detector 103 is a detector for two-dimensionally displaying by voltage, an incident position of an electron beam or a ray and is also called a PSD (Position Sensitive Detector). A pair of position detectors 103 are disposed in positions at which the diffraction spots of the position to be observed with respect to the direction of a primary electron beam. By processing the difference of output voltages from the two position detectors 103 by a signal processing circuit 11, a signal of the voltage corresponding to a change amount of the lattice plane spacing, that is, a strain amount or stress is obtained. Since the signal of the voltage corresponding to the strain amount or stress can be derived directly from the signal processing circuit 11, measurement and analysis of the profile as shown in FIG. 6 becomes unnecessary. Consequently, the method has an advantage that high-speed observation can be realized. An enlarged image is obtained by the pixel detector 104 in a manner similar to FIG. 7. The method still has complication of frequently switching two optical paths, as a drawback similar to that of the foregoing method shown in FIG. 7.

Figure 9:
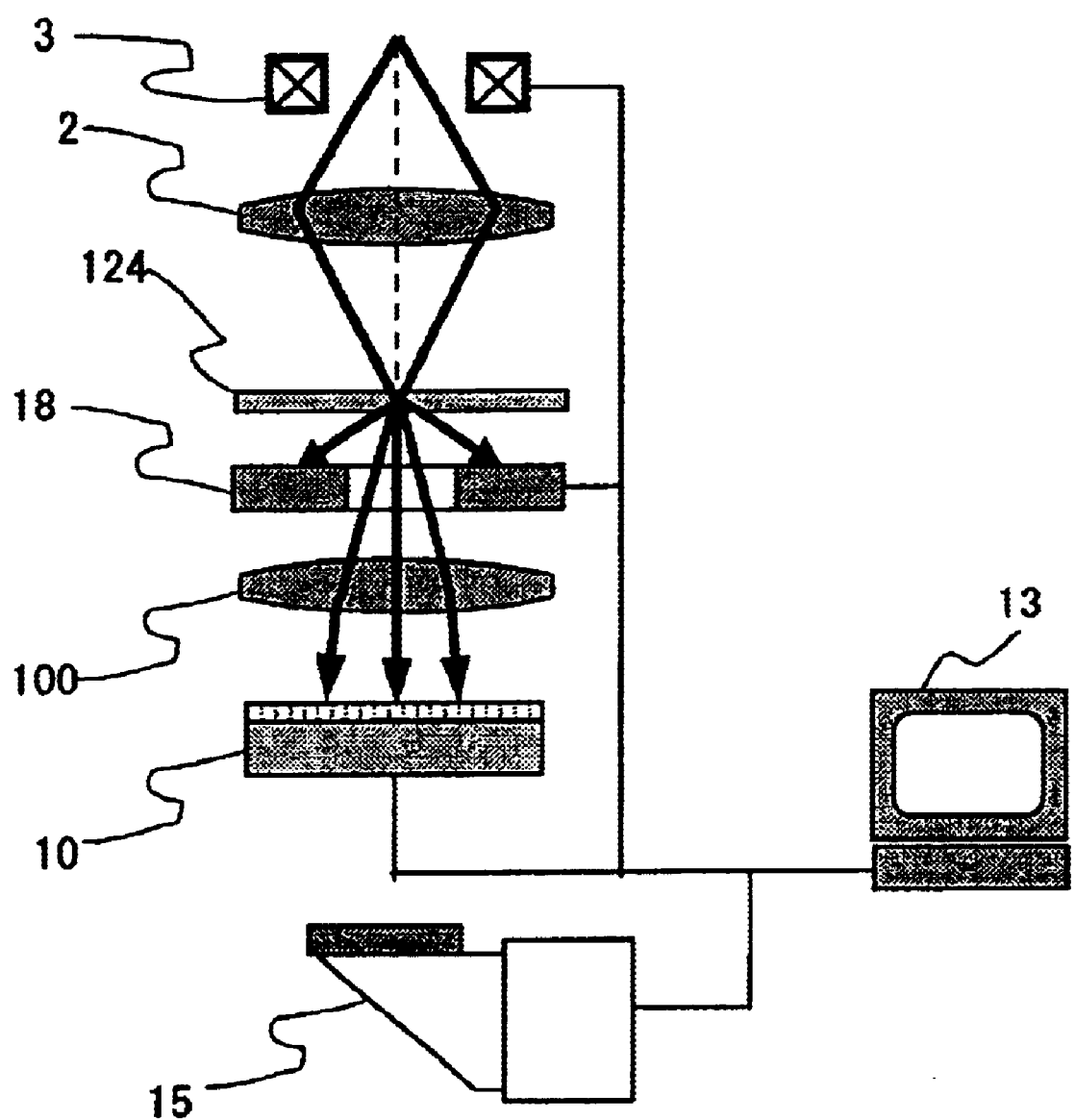
FIG. 9 is a schematic explanatory diagram showing an example of the configuration of an observation apparatus obtained by assembling both an STEM detector and a pixel detector in a scanning transmission electron microscope (STEM) system according to the invention.

Next, there is devised a technique of applying the invention to a scanning transmission electron microscope (hereinbelow, STEM), by using the fact that an electron beam is converged to 10 nm or less to acquire an image of nano-diffraction, for scanning the converged electron beam over a sample surface and forming an image by obtaining synchronization between a scanning coil signal (irradiation position information) and a detection signal (signal intensity). In FIG. 9, a diffraction image is obtained by the pixel detector 104 in a manner similar to FIG. 7. An enlarged image is obtained by a dark field type detector 18 or a bright field type detector 15 generally used for the scanning transmission electron microscope. Each of the detectors outputs the intensity of an incident electron beam as a signal voltage. In the display device 13, synchronously with a signal voltage of an STEM scan coil 3, an enlarged image of the specimen is formed. A diffraction image as shown in FIG. 5 is obtained from the pixel detector 104, and it is necessary to measure a profile as shown in FIG. 6 from the diffraction image. Therefore, it is difficult to detect a strain or stress value at high speed. However, different from the methods of FIGS. 7 and 8, this method has an advantage that, from the viewpoint of stability of operation and reproducibility of a measurement position, the parameters of the irradiation lens 2 do not have to be changed. Further, both the dark field type detector 18 and the pixel detector 104 can physically exist and an enlarged image and a diffraction image can be simultaneously observed by a common scan electron beam. The method has therefore a big advantage such that the position in which the diffraction image is measured and the enlarged image of the structure in the specimen can be associated with each other at high precision. On the other hand, at the time of using the bright field type detector 15, during observation of an enlarged image, the pixel detector 104 has to be moved away from the electron beam path. During the period, the enlarged image and the diffraction image cannot be observed simultaneously.

Figure 10:
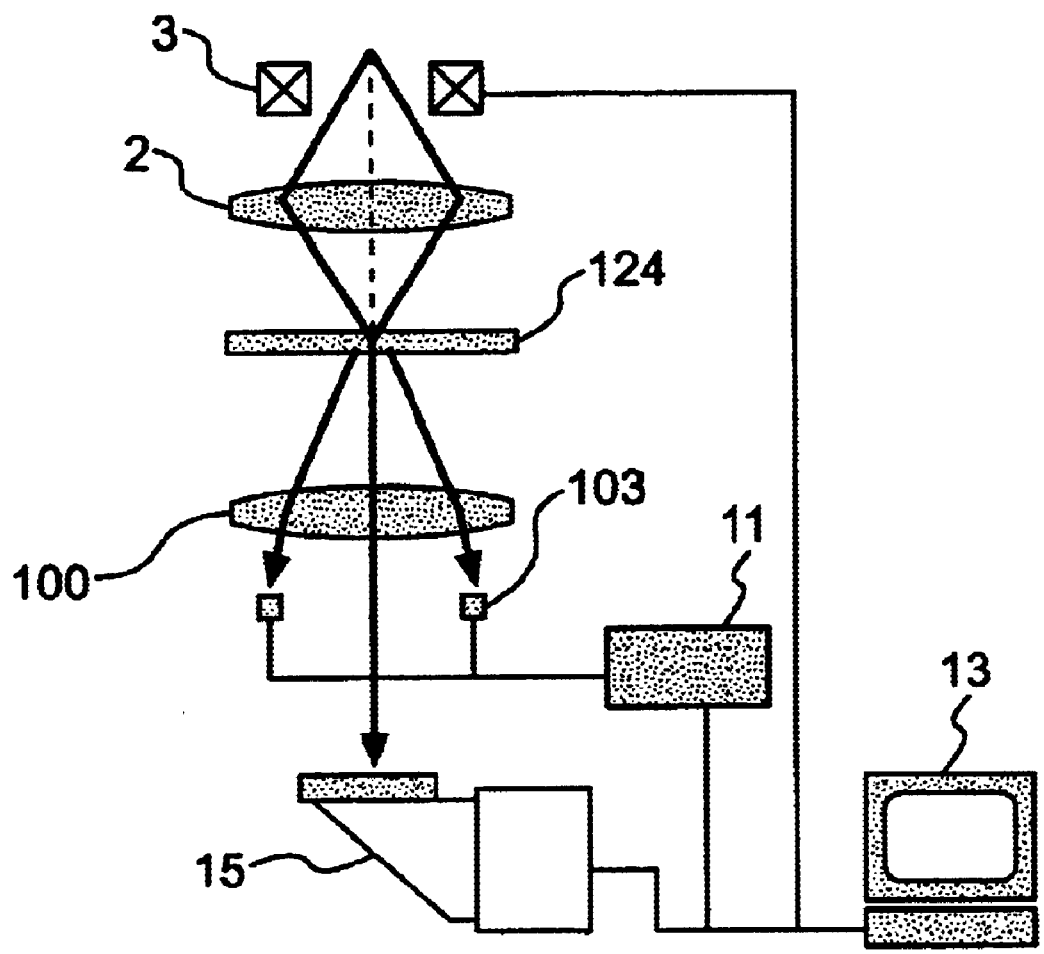
FIG. 10 is a schematic diagram for explaining an example of the configuration of an observation apparatus obtained by assembling both an STEM detector and a position detector in a scanning transmission electron microscope (STEM) system according to the invention.

FIG. 10 shows a method of detecting a diffraction image by the position detector 103 and detecting an enlarged image by the bright field type detector 15. By the method, in a manner similar to the case of FIG. 9, the diffraction image and the enlarged image can be simultaneously observed by a common scan electron beam. Since it is unnecessary to change the parameters of the irradiation lens 2 and a signal voltage corresponding to a strain amount or stress is directly obtained from the position detector 8, observation is made at extremely high speed. Further, the method has a big advantage such that there is no deviation between the enlarged image and a two-dimensional distribution image of strain or stress. An enlarged image can be also acquired by the dark field type detector 18 disposed in the position shown in FIG. 9.

The method of measuring a strain and a stress of a very small portion by using the nano-diffraction method, and the electron beam emitting/detecting method have been described above. The configuration of the apparatus will be briefly described by referring to FIG. 1. An electron beam emitted from the FE electron gun 1 is shaped to a parallel microprobe by the irradiation lens 2, and a specimen 6 is irradiated with the microprobe. In the case of irradiating another position in the specimen 6 with the microprobe, either a method of moving a beam by the STEM scan coil 3 or the method of moving the specimen by a specimen stage 21 is employed. The magnification of the electron beam passed through the specimen is changed by a first projection lens 4 and the resultant beam is focused onto the detector by a second projection lens 5. The role of the first projection lens 4 and that of the second projection lens 5 can be changed with each other. Diffracted electrons 7 are used to measure the incident position of the electron beam by a position detector 8 or to measure the incident position and intensity by a pixel detector 10. On the other hand, an electron beam having image information is used to measure the incident position and intensity by the pixel detector 10 or to measure the intensity by the bright field type detector 15 or dark field type detector 18. Since the dark field type detector 18 and the pixel detector 10 are provided on the electron beam path, they may be obstacles for other detectors. In order to move the detector 18 and the pixel detector 10 away from the electron beam path, optical axis coming/outgoing mechanisms 20 and 17 are provided, respectively. Since a diffraction image rotates in a plane perpendicular to the axial direction of the irradiated electron beam in accordance with the direction of setting the specimen 6, a rotation mechanism 9 is provided to adjust the relative angle relationship between the diffraction image and the position detector 8 so that the position detector 8 can be rotated in a plane perpendicular to the electron beam axis.

Two position detectors 8 are constructed as a set and are disposed in positions of, for example, the 220 point and the −220 point in a diffraction image. It is also effective to use four position detectors 8 as a set and dispose the position detectors 8 in the above described two positions and further positions of 002 point and 00-2 point and measure both strain and stress in two directions.

The signal voltage of an output signal of the position detector 8 indicates the incident position of the electron beam. In order to obtain the diffraction spot spacing, a signal voltage difference between the two position detectors 8 is calculated by the signal processing circuit 11. The signal voltage difference of the position detectors 8 may be calculated by an analog differential circuit or by converting output signals into digital signals and calculating a difference between the signal voltages on a memory. The differential voltage may be output in digital numerical values or converted to analog signals, and the analog signals may be output. In any of the methods, a signal voltage value corresponding to the distance between diffraction spots is transferred to the display device 13 and synchronized with the signal voltage value of the STEM scan coil 3, and the resultant is two-dimensionally displayed, thereby enabling a two-dimensional mapping image corresponding to strain and stress amounts to be obtained. On the other hand, the enlarged image of the specimen 6 corresponding to the two-dimensional mapping image is sent via the dark field detector 19, bright field detector 16, and signal processing circuit 12, and displayed on the display device 13. In the case of detecting the diffraction image by the pixel detector 10, measurement of a diffraction spot profile, fitting of the measured profile by the Gaussian distribution, and calculation by performing image processing on the distance between diffraction spots are carried out. A voltage signal or voltage value corresponding to the distance between the diffraction spots is output and transmitted to the display device 13. The apparatus has the configuration that an energy filter 14 is disposed above the various detectors in order to eliminate contrast due to inelastic scattering electrons generated as a background of the diffraction image in the case of observing a thick specimen.

A stress measuring algorithm will now be described. Measurement using a TEM in FIG. 15 and measurement using an STEM in FIG. 16 will be described.

Figure 15:
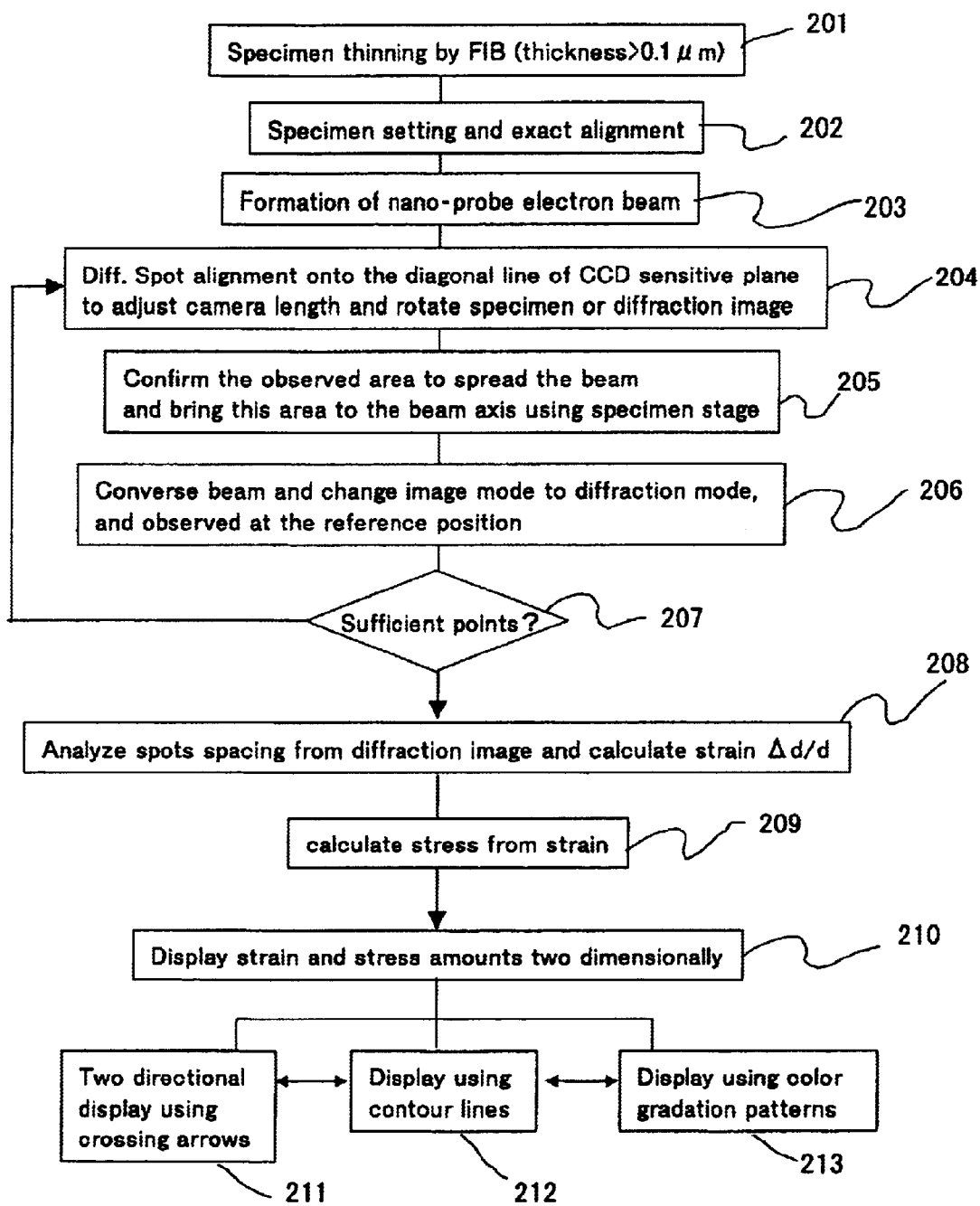
FIG. 15 is a flowchart showing an example of a procedure taken at the time of obtaining a distribution of stress in a specimen by using a pixel detector from a TEM diffraction image of the specimen in the observation method of the invention.

In the case of using a TEM, first, as shown in processing step 201 in FIG. 15, a specimen is thinned to a thickness of 0.1 μm or more. An FIB (Focused Ion Beam) processing method which is effective at generating a specimen of an electronic microscope and widely used is appropriate. In the conventional CBED method, a change in lattice spacing is obtained from a high-order electron diffraction image. However, due to the high order, the signal intensity is weak. In the case where a specimen is thick, due to absorption in the specimen, the quality of a diffraction image deteriorates severely. Therefore, observation of a diffraction image is made by setting the specimen thickness to 0.1 μm or less. However, from a stress relaxation viewpoint at the time of processing a specimen, a thicker specimen is desirable. In the invention, strain and stress can be calculated from a low-order diffraction image, thereby enabling observation with the target specimen thickness of 0.1 μm or thicker to be performed. In processing step 202, a specimen is set on a specimen stage of the electron microscope, and orientation is adjusted by the specimen stage so that the electron beam enters the crystal plane strictly in parallel. After that, a diffraction image is acquired. It is known that, if the specimen is tilted, variations occur in the intensity of the diffraction spots and precision of measurement of the distance between diffraction spots deteriorates. To prevent it, the adjustment of orientation is indispensable. In processing step 203, the nano-diffraction optical path 53 illustrated in FIG. 4 is formed. In processing step 204, by adjusting the projection lens, a diffraction image of a size adapted to the photosensitive area of a camera achieving focus is formed on a pixel detector such as a CCD. To accurately measure the distance between diffraction spots, it is desired that the diffraction spots are apart from each other as much as possible on the photosensitive face of the camera. In the case of forming a diffraction image on a CCD having, for example, a square-shaped photosensitive face, to make a pair of diffraction spots of which spacing is to be measured align on a diagonal line of the photosensitive face, either the specimen, diffraction image, or pixel detector is rotated. The diffraction image is rotated by adjusting the projection lens. After the diffraction image is obtained by the nano-diffraction method, specimen irradiation parameters are changed to widen the electron beam. An observation field is checked on the enlarged image of the TEM, and a measurement point is retrieved. At this time, the relative positions of the crystalline specimen and the electron beam are changed. Although the electron beam may be moved to the target field position, more preferably, as in processing step 205, the observation field of the specimen is moved onto the irradiation electron beam path by moving the specimen stage since a strain or the like of the diffusion image can be prevented. Subsequently, in processing step 207, observation is repeated while alternately switching the enlarged image observation and diffraction image observation. When it is determined in step 207 that measurement of the target number of measurement spots is completed, the obtained diffraction image is analyzed. The program moves to a step of obtaining characteristics of the crystal, that is, a strain and a stress in the crystal.

Figure 12:
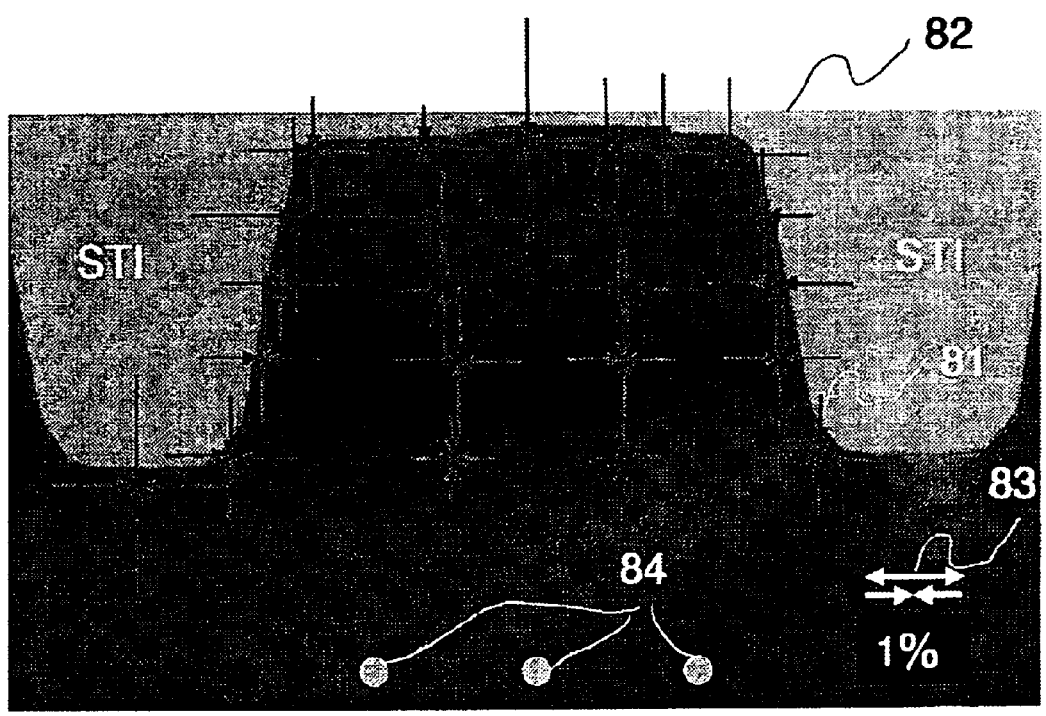
FIG. 12 is a schematic view for explaining an example of an observation result displaying method in the observation method of the invention.
Figure 13:
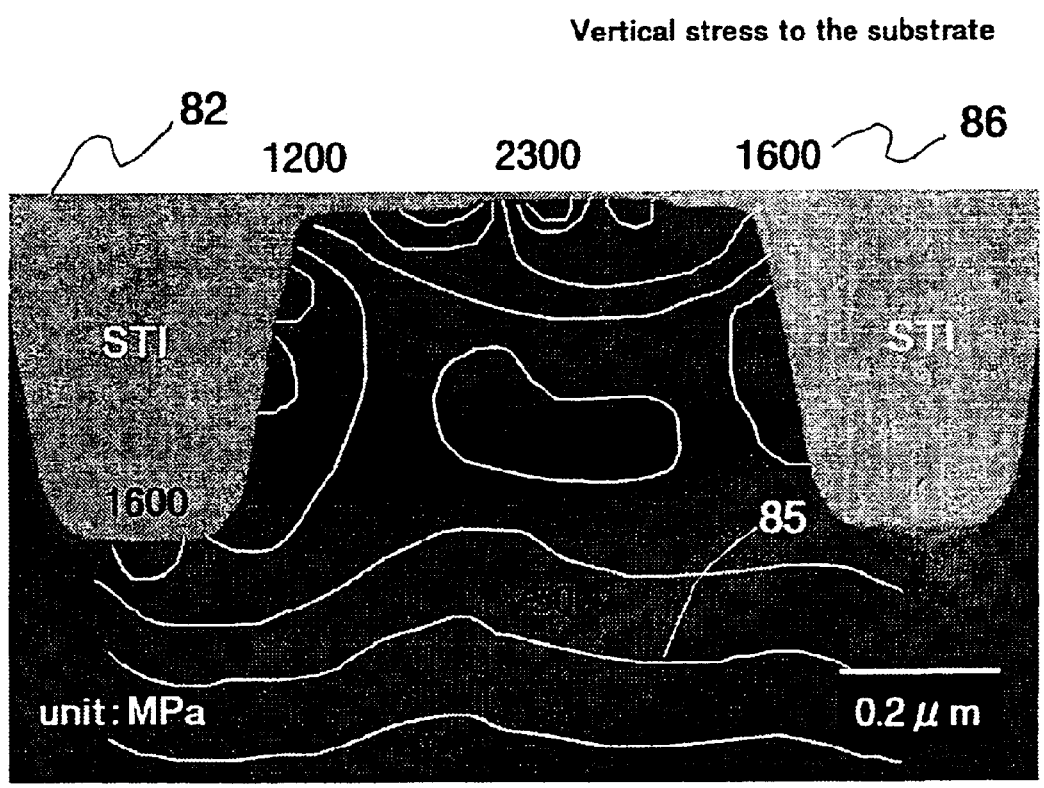
FIG. 13 is a schematic view for explaining another example of the observation result displaying method in the observation method of the invention.

First, in processing step 208, the target spots spacing is measured and a deviation of the target spots spacing from the reference value is obtained, thereby calculating a strain Δd/d. Subsequently, in processing step 209, by multiplying the obtained strain amount with an elastic coefficient which differs according to the elements in the specimen, the crystal structure, and the crystal plane, the stress in the specimen is calculated. For example, in the case of a silicon (220) plane, elastic coefficient k=1300 MPa. In the case of a silicon (002) plane, elastic coefficient k=1700 MPa. It is understood that, when the diffraction spot shifts by 0.1% in the silicon (220) plane, the stress in the specimen is 130 MPa. Finally, the data is arranged in forms as shown in FIGS. 12, 13, and 14. In processing step 210, two-dimensional distributions in planes where the obtained strain and stress amounts are measured are visualized and displayed. Specifically, on an enlarged image in the measurement plane of the specimen, characteristic values of strain, stress, and the like are superimposed by methods such as two-directional display using crossing arrows (processing step 211) as shown in FIG. 12, display using contour lines (processing step 212) as shown in FIG. 13, and display using color gradation patterns (processing step 213) as shown in FIG. 14. By properly using the display methods, a measurement result is displayed on the display screen of a computer for display.

Figure 16:
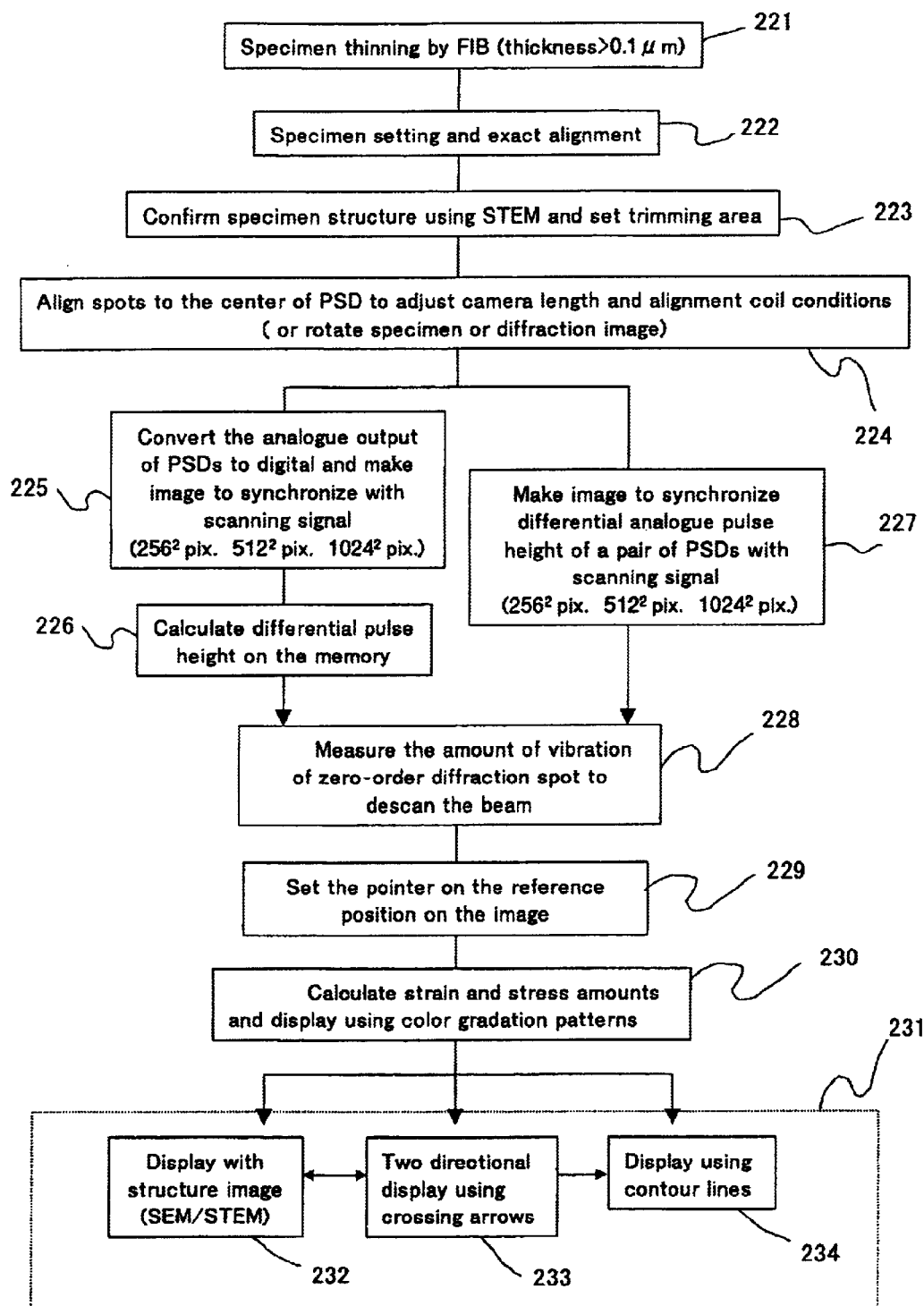
FIG. 16 is a flowchart showing an example of a procedure taken at the time of obtaining a distribution of stress in a specimen by using a position detector from an STEM diffraction image of the specimen in the observation method of the invention.

In the case of using an STEM, in processing step 221 in FIG. 16, with respect to fabrication of a specimen, in a manner similar to the case of using the TEM (FIG. 15), a flat and rather thick film is generated by an FIB process. Subsequently, in processing step 222, exact alignment is obtained. In processing step 223, the specimen structure is checked by using an STEM image and, as will be described later in a third embodiment, a trimming position of the observation area is designated. After that, in processing step 224, the diffraction image is aligned so as to be on a position detector. Subsequently, an output of the position detector is converted to a digital signal synchronously with the voltage value, that is, irradiation position information, of a scanning coil (processing step 225). An output voltage difference between the pair of detectors is calculated (processing step 226) or the output voltage difference is processed by an analog circuit, and an analog signal voltage corresponding to the output voltage difference is output (processing step 227). In the case were a diffraction image is scanned at the time of beam scanning due to aberrations of the irradiation lens and the object lens, a positional deviation amount of the diffraction image is detected by an image process according to a cross-correlation method or phase regulated correlation method, and a process of feeding back descan for descanning the scan of the diffraction image to a deflecting coil or the like is performed (processing step 228). Subsequently, the pointer is set on the reference position on the enlarged image (processing step 229) and, by using the lattice spacing, strain and stress amounts are calculated (processing step 230). Finally, the calculated strain and stress amounts are two-dimensionally displayed synchronously with the voltage value of the scanning coil, that is, irradiation position information (processing step 231). In this case as well, display of an image of the structure in the specimen on the computer for display (processing step 232), display of the strain and stress amounts in the sample by using two-directional crossing arrows (processing step 233), or display using contour lines (processing step 234) can be properly performed.

The above procedure can be summarized as follows.

The method of detecting a diffraction image by the position detector 103 and detecting an enlarged image by the bright field type detector 15 shown in FIG. 10 is characterized by including: a step of mounting a specimen on a specimen stage; a step of irradiating a first area in the specimen with an electron beam while scanning the electron beam, and acquiring an enlarged image (STEM image) of the first area in the specimen by using the electron beam passed through the specimen; and a step of fixedly irradiating a second area in the specimen with an electron beam, and detecting a diffraction image of the second area in the specimen by first detecting means by using the electron beam diffracted in the specimen. In this case, the first detecting means is a pair of (two) position detectors (detectors having a function of two-dimensionally displaying an incident position of an electron beam and rays in the form of voltage).

The method of detecting both a diffraction image and an enlarged image by a pixel detector shown in FIG. 7 is characterized by including: a step of mounting a specimen on a specimen stage; a step of irradiating a first area in the specimen with an electron beam and detecting a first diffraction image formed by an electron beam diffracted in the specimen by using second detecting means; a step of irradiating a second area in the specimen with the electron beam and detecting a second diffraction image of the second area formed by the electron beam diffracted in the specimen by using the second detector; and a step of irradiating a third area including both of the first and second areas with the electron beam and acquiring an enlarged image of the third area by using an electron beam passed through the specimen by the second detecting means. The second detecting means refers to detecting means having the function of outputting information regarding incident positions of an electron beam and rays and intensity of incident light as output signals. Between the step of detecting the first diffraction image and the step of detecting the second diffraction image, an added step is provided for shifting an area irradiated with the electron beam of the specimen from the first area to the second area by changing relative positions of the specimen and the electron beams. Before the step of acquiring an enlarged image of the third area, obviously, an added step of shifting an irradiation mode of the electron beam from a mode of forming the diffraction image to a mode for forming the enlarged image by changing the condition of irradiating the sample with the electron beam is provided. Finally, the method is further provided with a signal processing step for obtaining crystal characteristics of the specimen from the first and second diffraction images acquired in the steps, and a step of displaying the crystal characteristic value of the specimen obtained by the signal processing step so as to be superimposed on the enlarged image acquired by the above step.

The method of detecting a diffraction image by a pixel detector and detecting an enlarged image by a bright field type detector and/or a dark field type detector shown in FIG. 9 is characterized by including: a step of mounting a specimen (crystalline specimen) on a specimen stage; a first diffraction image acquiring step of irradiating a first area in the specimen with an electron beam while scanning the electron beam and detecting a first diffraction image of the first area in the specimen formed by an electron beam diffracted in the specimen by using a pixel detector; a second diffraction image acquiring step of, by changing relative positions between the specimen and the irradiation electron beam, irradiating a second area in the specimen with the electron beam while scanning the electron beam and detecting a second diffraction image of the second area in the specimen, formed by the electron beam diffracted in the specimen by using the pixel detector; an enlarged image acquiring step of shifting the electron beam emitting mode from a mode of forming the diffraction image to a mode of forming the enlarged image by changing the condition of irradiating the specimen with the electron beam, irradiating a third area including both the first and second areas with the electron beam, and detecting an enlarged image of the third area formed by an electron beam passed through the specimen by third detecting means; and a crystal characteristic obtaining step of obtaining a crystal characteristic of the specimen from the first and second diffraction images acquired in the first and second diffraction image acquiring steps. The third detector is a bright field type detector or a dark field type detector attached to an STEM, and has a function of outputting a signal voltage proportional to an intensity of an incident electron beam or rays.

The method of detecting a diffraction image of a specimen by a position detector and detecting an enlarged image by a pixel detector shown in FIG. 8 is characterized by including: a step of mounting a specimen (crystalline specimen) on a specimen stage; a step of irradiating a first area in the specimen with a converged electron beam; a first diffraction image acquiring step of detecting a first diffraction image of the first area in the specimen formed by an electron beam diffracted in the specimen by using a first detector; a second diffraction image acquiring step of, by changing relative positions between the specimen and the converged electron beam, irradiating a second area in the specimen with the converged electron beam and detecting a second diffraction image of the second area in the specimen, formed by the electron beam diffracted in the specimen by using the first detector; an enlarged image acquiring step of changing a mode of irradiating the specimen with the electron beam from a diffraction image acquiring mode to an enlarged image acquiring mode by changing the condition of irradiating the specimen with the electron beam, and acquiring an enlarged image of a third area including both the first and second areas; a step of obtaining a crystal characteristic value of the first and second areas from diffraction images of the first and second areas acquired in the first and second diffraction image acquiring steps; and a step of displaying the crystal characteristic value of the first and second areas so as to be superimposed on the enlarged image of the third area obtained by the enlarged image acquiring step.

Second Embodiment

A second embodiment relates to a method of measuring a strain and a stress in a specimen (semiconductor device) by using a TEM system having the configuration described in the foregoing first embodiment, and a method of displaying the obtained measurement values (strain and stress amounts).

Figure 11:
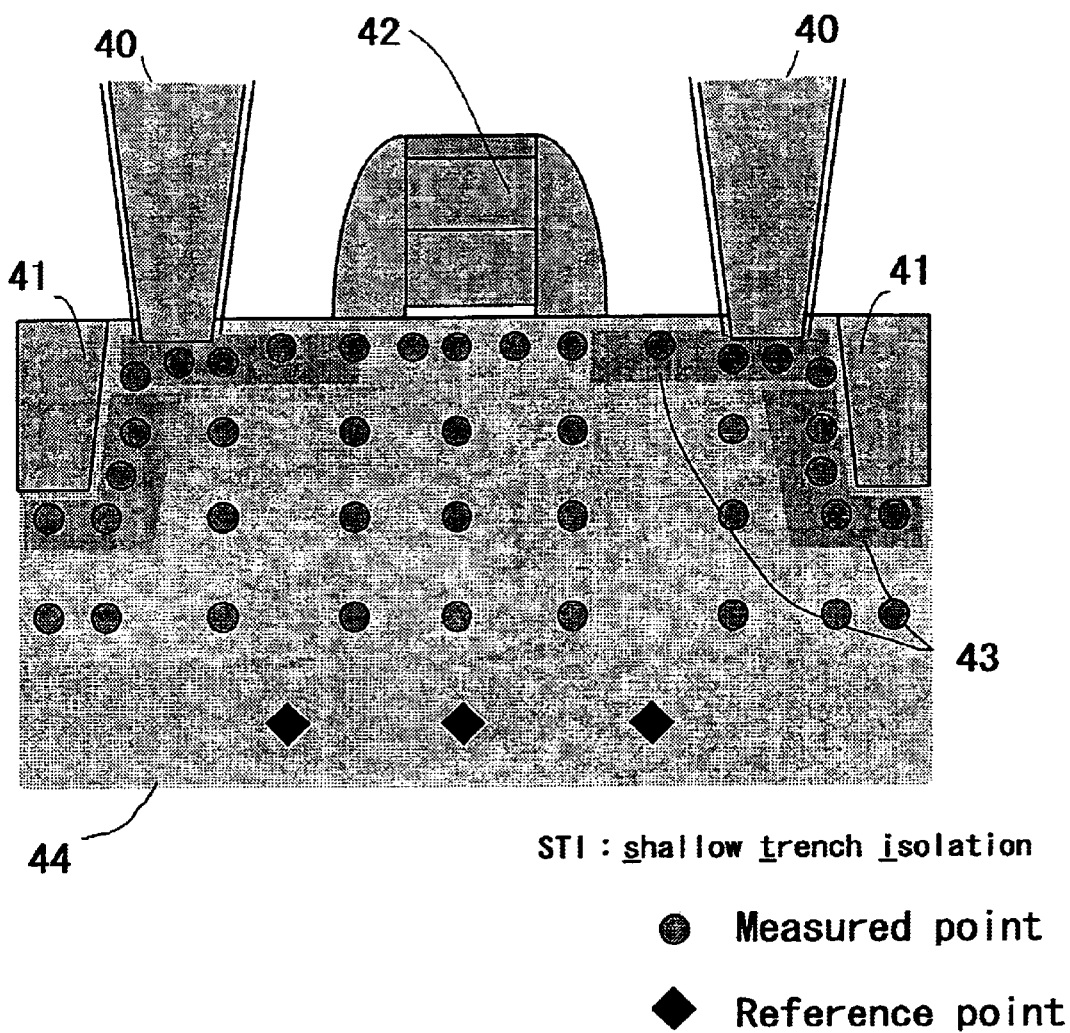
FIG. 11 is a schematic cross section showing an example of the structure of a semiconductor device as an example of a specimen to be observed according to an observation method of the invention.

A transmission electron microscope (TEM) and a scanning transmission electron microscope (STEM) use, as information, interaction which occurs when an emitted electron beam passes through the specimen, so that a portion to be measured in the specimen has to be thinned. Many film thinning methods such as a method of using an ion beam have been practically used. FIG. 11 shows a sectional structure of a semiconductor transistor obtained by cutting out the portion to be measured by using the film thinning method. In a transistor having a typical structure, a plug 40 and a gate 42 are formed on a region sandwiched by device isolation layers 41 in a silicon substrate 44. In many cases, the crystal structure in a stress generating field 43 in the diagram is largely strained. Even in such a case, in a deep region of the substrate 44, the original silicon crystal state often remains. Therefore, the deep region is used as a reference point of measurement of a lattice spacing and, by irradiating a plurality of reference points indicated by the symbol ♦ in the drawing with the electron beam, a diffraction image (or an output signal of a voltage value corresponding to the lattice spacing) is acquired. Subsequently, by similarly measuring a plurality of measurement points as shown by the symbol ● in the drawing, a change amount in the lattice spacing between the measurement points with respect to the lattice spacing between the reference points is calculated. Simultaneously, an enlarged image showing a specimen structure of an expanded region including the measurement points is obtained.

The change amount in the lattice spacing, that is, the strain amount of the measurement points is superimposed on an enlarged image of the specimen structure obtained by the above-described measuring method as shown in FIG. 12. Specifically, FIG. 12 shows a strain amount of each of the measurement points by writing arrows 31 for displaying the intensity of the strain amount of a length proportional to the strain amount of each of the measurement points onto a specimen enlarged image 32 illustrating the specimen structure. The relation between the length of the arrow 31 and the strain amount is indicated by a scale bar 33. The arrows in the two directions of the direction parallel to the substrate and the direction perpendicular to the substrate are crossed, and the cross point of the arrows in the two directions indicates an electron beam irradiation position (measurement point). A pair of inside-pointing arrows indicate a compression strain, and a double-headed arrow indicates a tensile strain. On the enlarged image 32 of the specimen structure, reference point indications (●) 34 are also displayed. Further, since the strain amount and the stress amount have a proportional relation, the length of an arrow may indicate a stress amount. In this case, it is obvious that the scale bar 33 is displayed to specify the stress amount.

Another example of the measurement result display method can be also considered. For example, on the basis of the data of FIG. 12, points (measurement points) indicative of equal strain amounts (or stress amounts) are connected by an equal strain line (or equal stress line) and displayed. FIG. 13 shows an example of displaying points (measurement points) indicative of the same stress amount, which are connected via an equal stress line 85. In this case as well, the equal stress line 85 and stress value display 86 are superimposed on the enlarged image (enlarged photographic image) 32 of the specimen structure. According to the display method, although only the strain amount (or stress amount) distribution in one direction can be displayed on an enlarged photographic image, the method has an advantage such that a change in the strain or stress amount and a distribution shape are clearer.

According to a display method using a stress color map 90 shown in FIG. 14, a stress amount at each measurement point is displayed in color gradations specified by a color scale bar 91. The display method has an advantage that both the stress value and the strain amount can be shown in the color scale bar 91 and, in addition, in the case where tensile stress and compressive stress are mixed, they are more clearly displayed.

Third Embodiment

Figure 17:
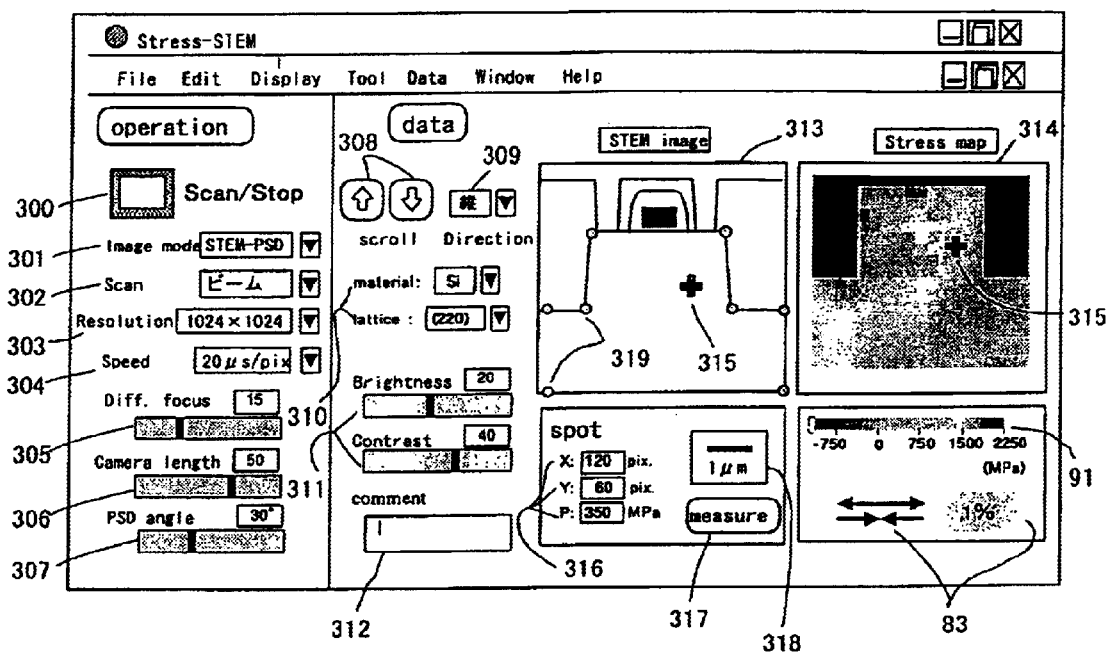
FIG. 17 is a schematic view for explaining an example of displaying an operation screen in the observation apparatus according to the invention.

FIG. 17 shows an example of an operation screen displayed on the display screen of the computer for display in the display device 13 illustrated in FIG. 1. The operation screen is broadly divided into a display portion for operation and a display portion for measurement result. In the display portion for operation, a data collection start/stop button 300 is provided. From an observation method selection pull-down menu 301, one of the four measurement methods shown in FIGS. 8 to 10 is selected. In the case of changing the irradiation position of an electron beam to a specimen to be observed, whether the electron beam is moved or the specimen side is moved by moving the specimen stage is selected by a scan method selection pull-down menu 302. The resolution of an acquired image can be changed by selecting the scan width of the electron beam or the number of pixels of a camera, binding of pixels, or the like, and any of them is selected from a resolution selection pull-down menu 303. Similarly, scan speed is selected from a scan speed selection pull-down menu 304. The higher the resolution is, the longer it takes time to acquire an image. The lower the scan speed is, the higher the S/N ratio of an acquired image is, but it takes longer time to acquire an image. Therefore, the parameters have to be selected and set from the various menus in consideration of the above so that the optimum measurement parameters according to a purpose can be obtained. Further, focusing and the size of the diffraction image are adjusted by using a control and display bar 305 of the irradiation lens 1 and a control and display bar 306 of the irradiation lens 2. It has been described in the foregoing first embodiment that the angle of setting the position detector is adjusted by the rotation mechanism 9 illustrated in FIG. 1. The angle can be adjusted by a PSD angle remote control bar 307.

In the result display portion, a plurality of images can be displayed in parallel. The images to be displayed are selected among various structure images and various stress distribution images by a display scroll button 308 of the result display screen. In the case where only a result of a strain or stress in one direction is displayed in one image, the direction is selected from a stress display direction selection pull-down menu 309. It has been already described that the elastic coefficient differs according to the material and the type of the lattice plane. The elastic coefficients are stored as a database. After measurement, by setting a parameter from a material and crystal plane direction selection pull-down menu 310, the strain amount display can be automatically switched to the stress amount display. The brightness and contrast of an image has to be properly adjusted in accordance with the gradation and luminance of the image. A gain and an offset amount of the image are adjusted by a display image brightness adjusting bar 311. In the embodiment, an STEM bright field image is displayed on a result display portion 313, and a stress map is displayed in a result display portion 314. For example, a structure image is observed first and a target field is determined. After that, a scan area designation point 319 is designated. In an actual specimen, in many cases, a stress amount of only the substrate portion is measured. A stress amount of other structures such as an amorphous region such as an oxide film is not measured. Therefore, by blanking the scan coil on the outside of a closed region formed by connecting scan area designation points 319 so as not to scan an area other than the target region, scan time can be shortened. In such a manner, a stress map corresponding to a structure image is displayed. By displaying the coordinates and the stress value in the position of a spot measurement pointer 315 displayed on both screens in a spot measurement position and measurement value display portion 316, quantitative argument of not only the whole image of the measurement region but also a local portion of a particular interest can be made, so that it is very effective. In this case, a scan bean does not scan but is fixed in a pointer designated position, and strain and stress values converted from a diffraction spots spacing are displayed in the spot measurement position and measurement value display portion 316. Stop of the scan beam and start and stop of measurement are instructed by a spot measurement start button 317. As scale bars of a structure image, a display result portion scale bar 318 is displayed and also a color scale bar 91 and a scale bar 83 are displayed below the stress map. Finally, at the time of storing data in a hard disk of a computer, a note regarding the data is stored so as to be attached in a text file. For this purpose, a comment input column 312 is provided in the operation screen.

Fourth Embodiment

Figure 18:
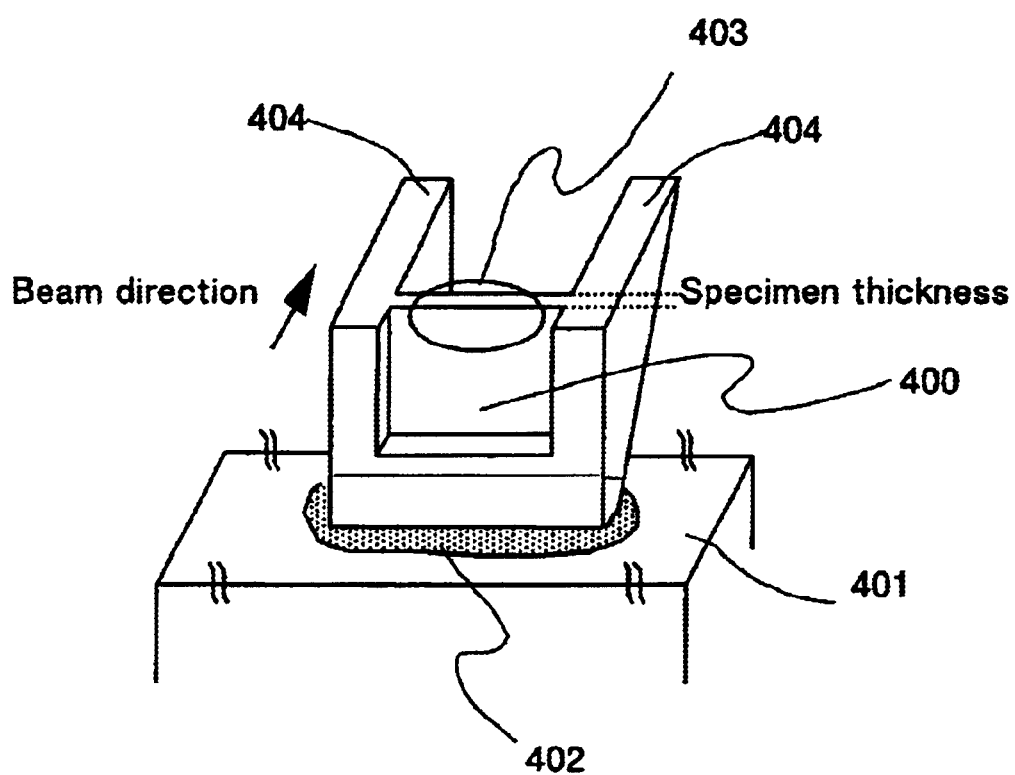
FIG. 18 is a schematic perspective view showing an example of the structure of a specimen for measuring stress, used in the observation method according to the invention.

In a general 200 to 300 kV electron microscope, a specimen has to be thinned to a thickness so as to transmit an electron beam, that is, 1 µm or less. By the film thinning process, strain or stress changes from the original state and is relaxed. Relaxation can be suppressed as much as possible by fabricating a specimen as thick as possible. In recent years, a technique of cutting out a part to be observed with an FIB (Focused Ion Beam) is being advanced, and a specimen 400 for an electron microscope having a shape as shown in FIG. 18 can be easily fabricated.

The size of the specimen 400 for an electron microscope is about 10×10×2 µm and, particularly, the thickness of the observation region is about 0.1 to 0.3 µm. The specimen 400 for an electron microscope is fixed on a mesh 401 with a tungsten deposition adhesion 402 so as to be easily handled by a pincette or the like. A specimen thin portion 403 is held by being sandwiched by specimen supporting portions 404. At this time, first, the portion sandwiched by the specimen supporting portions 404 in the sample thin portion 403 is narrowed as much as possible. If the portion is too wide, there is the possibility that a new stress occurs due to deformation of the specimen thin portion 403 or the like. For example, in the case of measuring only one bit of a transistor having the structure shown in FIG. 11, the width can be set to about 1 µm. In the case of measuring, for example, only one bit of a transistor having the structure shown in FIG. 11, the width can be set to about 1 µm. In the case of measuring a transistor of a plurality bits under the same condition, the width of the thin portion is set to about 5 µm. The specimen thin portion 403 is processed to have a predetermined thickness, and a process of thinning a damage layer as much as possible by decreasing an irradiation ion energy for a finishing process is performed.

Fifth Embodiment

A fifth embodiment relates to the structure of an electron beam detector. The configuration of the electron beam detector according to the embodiment will be described by referring to FIGS. 19A and 19B and FIGS. 20A, 20B, and 20C.

Figure 19A:
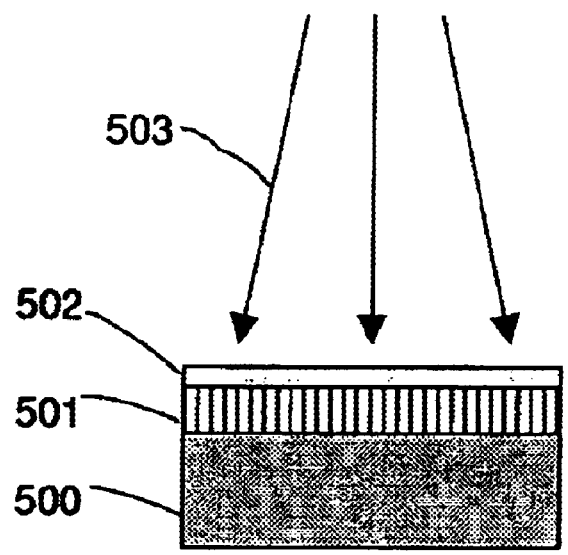
FIGS. 19A and 19B are schematic views each for explaining a configuration of a pixel detector for use in an observation apparatus according to the invention.
Figure 19B:
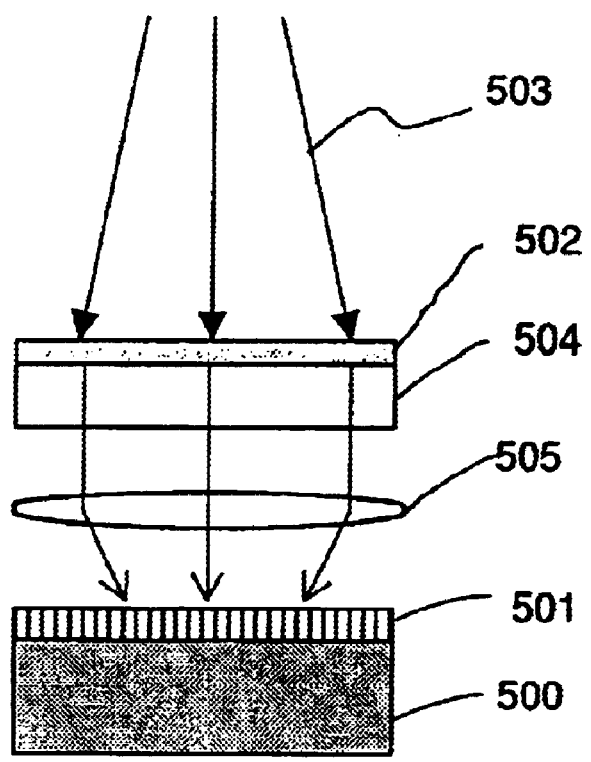

FIGS. 19A and 19B show an example of the configuration of a pixel detector 500. An electron beam cannot be directly detected by the pixel detector 500 made of a semiconductor such as a CCD or line sensor for the reason that the detector deteriorates due to a damage caused by incidence of an electron beam. As shown in FIG. 19A, a diffracted electron beam 503 is once converted to light by a scintillator 502 which is resistant to damages, and the light is incident on a sensitive plane of the pixel detector 500 via an optical fiber plate 501 and is detected. Since the diffracted electron beam 503 is scattered and expands in the scintillator 502, the scintillator 502 is usually polished so as to be thinned to a thickness of 100 µm or less. It is therefore difficult to provide the scintillator 502 directly on the pixel detector 500. The scintillator 502 is provided over the pixel detector 500 via the optical fiber plate 501 to allow light from the scintillator 502 to enter the pixel detector 500 via the optical fiber plate 501.

Further, in the case where the scintillator 502 cannot be provided directly on the optical fiber plate 501, as shown in FIG. 19B, an optical image from the scintillator 502 is formed on the sensitive plane of the pixel detector 500 by using an optical lens 505. When the depth of focus of the optical lens 505 is deep, if the scintillator 502 is not thinned, an image is blurred. Consequently, a glass substrate 504 as a supporting substrate is necessary for the thinned scintillator 502. When the depth of focus of the optical lens 505 is sufficiently shallower than the depth of entry of the electron beam in the scintillator 502, it is unnecessary to thin the scintillator 502.

FIGS. 20A, 20B, and 20C show an example of the configuration of a detection system in the case of observing a diffraction image by using a plurality of position detectors. In the case where the scintillator 502 can be directly adhered onto the position detector 506, a simple structure as shown in FIG. 20A can be employed. In this case, the scintillator 502 is thinned.

In the case where the scintillator 502 cannot be adhered directly onto the position detector 506, as shown in FIG. 20B, light (fluorescence) 507 emitted from the scintillator 502 thinned and adhered onto the glass substrate 504 is allowed to fall on the position detector 506 so as to form an image.

FIG. 20B shows an example of converting a whole diffraction image to an optical image by a single scintillator, forming an image on the position detector 506 provided for each diffraction spot by a single optical lens 505, and detecting the image. According to the mounting space and reduction in aberrations of the optical lens, there is also a case that the scintillator and the optical lens are provided for each diffraction image spot. In this case, the configuration shown in FIG. 20C is employed. Not-diffracted transmission electrons are completely stopped by a Faraday cup 508 to prevent occurrence of background noise caused by X rays around the position detector 506. The position of the position detector 506 relative to the diffracted electron beam is set to be adjustable (that is, movable in the directions x, y, and θ shown in the diagram). Particularly, when the position detector 506 is disposed in vacuum atmosphere, it is desirable to move the position detector 506 by an electric remote operating mechanism.

Sixth Embodiment

Figure 21A:
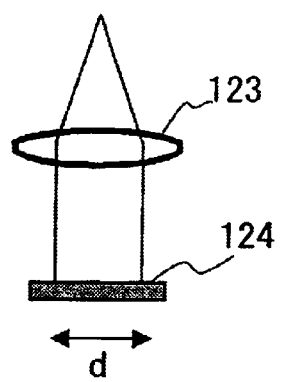
FIGS. 21A, 21B, and 21C are schematic perspective views showing the relations of a condition of irradiating an observation specimen with an electron beam, irradiation angle, and probe radius in the observation method according to the invention.
Figure 21B:
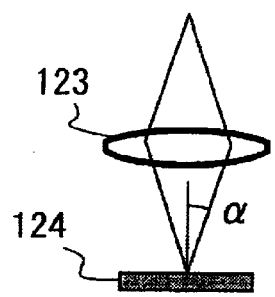
Figure 21C:
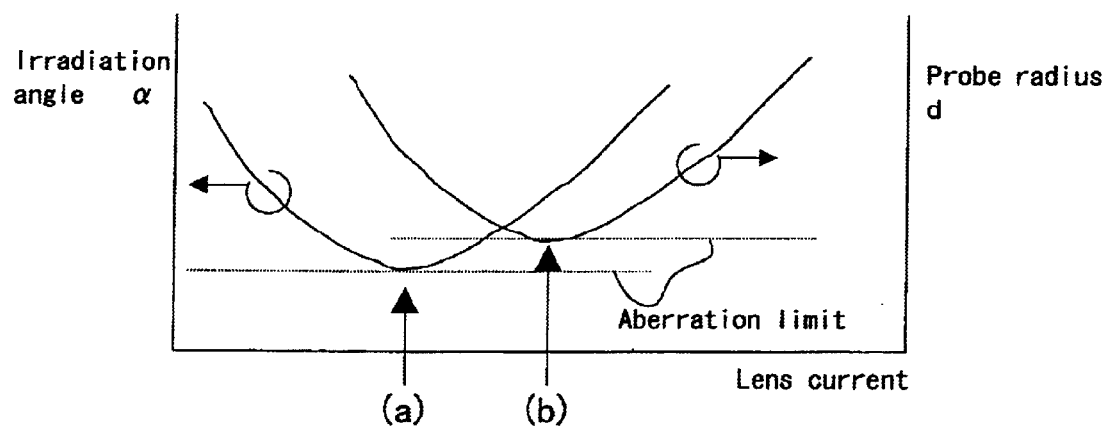

A sixth embodiment relates to an observing method by using an STEM. With reference to FIGS. 21A, 21B, and 21C, optimum electron beam irradiation parameters in the STEM method will be described. The convergence beam diameter (probe radius) "d" and the irradiation angle "α" of an irradiation electron beam are determined by lens parameters of the objective lens front magnetic field 123. Specifically, when the lens current is changed, under certain lens parameters, as shown in FIG. 21A, the emitted electron beam enters as a parallel beam perpendicular to the specimen 124. In this state, in the position indicated by the arrow (a) in FIG. 21C, the irradiation angle α can be decreased to the minimum at the aberration limit. When the lens current is increased from this state, the irradiation angle α increases whereas the probe radium "d" decreases. With certain lens parameters, the state of the minimum probe radius as shown in FIG. 21B is obtained. That is, in the state, in the position indicated by the arrow (b) in FIG. 21C, the limited minimum probe radius "d" at the aberration limit is obtained. It means that the optimum diffraction image forming parameters which can minimize the diffraction spot diameter and the optimum STEM enlarged image forming parameters which can obtain a specimen enlarged image having the highest resolution are different from each other. In the case of forming an image by a nano-diffraction method, the probe radius "d" of the irradiation electron beam can be set to 10 nmϕ or less even when the lens parameters shown in FIG. 21A are used. Consequently, even when the irradiation electron beam (probe beam) scans to form an STEM image, a resolution of about 10 nm (resolution to a degree at which the internal structure of a semiconductor device specimen can be recognized) is sufficiently obtained. Therefore, in the case of adding an operation algorithm for setting the lens current parameters as shown in FIG. 21B at the time of pre-observation of the specimen internal structure in processing step 223 shown in FIG. 16 and, at the time of observation of a diffraction image after that, switching the parameters to the lens current parameters as illustrated in FIG. 21A, both measurement of strain and stress with high sensitivity and observation of an enlarged STEM image with high resolution can be achieved.

Seventh Embodiment

Evaluations on strain and stress using an electron microscope have a problem of relaxation of strain and stress in a specimen at the time of processing a specimen as described above. Specifically, the strain and stress confined in the specimen is relaxed by the processing. Consequently, as described above, it is effective to observe the specimen in a thick state without thinning the specimen. In development of a semiconductor device, to establish a stress reducing process, a method of processing specimens fabricated under various conditions into the uniform shape and measuring a strain/stress distribution is effective. To be specific, when the shapes of specimens are the same, the relaxation amounts of strain and stress are almost the same. When measurement results are compared with each other, the probability that the difference in the measurement results is according to the difference in process parameters is very high. For example, the right and left stress distribution images of FIG. 14 are results of observation of specimens fabricated with different process parameters and processed in the same shape. A clear difference between the images can be recognized.

As described above, by selecting a transistor device to be observed from a wafer on a manufacturing line, processing observation specimens extracted from positions to be observed in the transistor device before and after a process to which attention is paid into the same shape, comparing the specimens with each other, and observing and evaluating the specimens, the accumulation state of stress and strain in the positions to be observed can be grasped. There is also a case such that a device is formed by performing a process A, after that, performing a process B on a specimen and performing a process C on another specimen. In this case, a specimen including the portion to be observed is extracted from the device subjected to the process B and that including portions to be observed is extracted from the device subjected to the process C, and stress and strain amounts are measured with respect to both of the specimens, thereby enabling advantages and disadvantages with respect to the stress and strain of the processes B and C to be grasped. By repeating it with respect to various processes, a stress reducing process can be found out.

As obviously understood from the above detailed description, according to the observation method of the invention, information regarding the crystal structure in a specimen (information regarding stress and strain in a specimen) can be measured with high sensitivity and high resolution.

According to the invention, the observation apparatus and the technique dedicated to operation of the apparatus can be shared by a customer and an analysis organization, so that cost and time required for observation and analysis can be largely reduced.

What is claimed is:

1. An observation method using an electron beam, comprising:

a step of mounting a specimen on a specimen stage;

a step of irradiating a first area in said specimen with an electron beam and detecting a first diffraction image formed by an electron beam diffracted in said specimen by using a first detector;

a step of irradiating a second area in said specimen with said electron beam and detecting a second diffraction image formed by the electron beam diffracted in said specimen by using said first detector;

a step of irradiating a third area including said first and second areas with said electron beam and acquiring an enlarged image of said specimen observed simultaneously with said first diffraction image or said second diffraction image by using an electron beam passed through said specimen;

a step of obtaining a characteristic value of a crystal structure in said first and second areas in said specimen on the basis of the detected information of said first and second diffraction images from said first detector; and a step of displaying said characteristic value so as to be superimposed on said enlarged image.

2. The observation method using an electron beam according to claim 1, wherein said first detector is a pixel detector.

3. An observation method using an electron beam, comprising:
- a step of mounting a specimen on a specimen stage;
- a step of irradiating a first area in said specimen with an electron beam while scanning the electron beam and detecting a first diffraction image formed by an electron beam diffracted in said specimen by a pixel detector;
- a step of irradiating a second area in said specimen with said electron beam while scanning the electron beam and detecting a second diffraction image formed by the electron beam diffracted in said specimen by using said pixel detector;
- a step of irradiating a third area including said first and second areas with said electron beam and detecting an enlarged image observed simultaneously with said first diffraction image or said second diffraction image formed by an electron beam passed through said specimen by a second detector; and
- a step of obtaining a characteristic value of a crystal structure in said first and second areas in said specimen on the basis of the detected information of said first and second diffraction images from said pixel detector.

4. The observation method using an electron beam according to claim 3, wherein said second detector is a bright field type detector or a dark field type detector.

5. An observation method using an electron beam, comprising:
- a step of mounting a specimen on a specimen stage;
- a step of irradiating a first area in said specimen with an electron beam converged to be narrow and detecting a first diffraction image formed by an electron beam diffracted in said specimen by a first detector;
- a step of irradiating a second area in a second area in said specimen with said electron beam converged to be narrow and detecting a second diffraction image formed by the electron beam diffracted in said specimen by said first detector;
- a step of irradiating a third area including said first and second areas in said specimen with said electron beam and acquiring an enlarged image of said third area in said specimen observed simultaneously with said first diffraction image or said second diffraction image;
- a step of obtaining a characteristic value of a crystal structure in said first and second areas in said specimen on the basis of the detected information of said first and second diffraction images from said first detector; and
- a step of displaying said characteristic value so as to be superimposed on said enlarged image.

* * * * *